(12) United States Patent
Lee et al.

(10) Patent No.: US 8,617,991 B2
(45) Date of Patent: Dec. 31, 2013

(54) METHOD OF MANUFACTURING SEMICONDUCTOR DEVICE

(75) Inventors: Jung-Chan Lee, Suwon-si (KR); Yoo-Jung Lee, Yongin-si (KR); Ki-Hyung Ko, Suwon-si (KR); Dae-Young Kwak, Seongnam-si (KR); Seung-Jae Lee, Hwaseong-si (KR); Jae-Sung Hur, Hwaseong-si (KR); Sang-Bom Kang, Seoul (KR); Cheol Kim, Hwaseong-si (KR); Bo-Un Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 7 days.

(21) Appl. No.: 13/526,960

(22) Filed: Jun. 19, 2012

(65) Prior Publication Data

US 2013/0012021 A1    Jan. 10, 2013

(30) Foreign Application Priority Data

Jul. 8, 2011  (KR) .................. 10-2011-0067900

(51) Int. Cl.
*H01L 21/44* (2006.01)

(52) U.S. Cl.
USPC ........... 438/672; 438/199; 438/216; 438/228; 438/257; 438/292; 257/E21.19

(58) Field of Classification Search
None
See application file for complete search history.

(56) References Cited

U.S. PATENT DOCUMENTS

2011/0089484 A1    4/2011  Lim et al.
2011/0248359 A1*  10/2011  Hwang et al. ............ 257/410

FOREIGN PATENT DOCUMENTS

JP   2007-165429      6/2007
KR   10-2002-0037942 A  5/2002

* cited by examiner

*Primary Examiner* — Kyoung Lee
(74) *Attorney, Agent, or Firm* — Lee & Morse, P.C.

(57) ABSTRACT

A method of manufacturing a semiconductor device includes forming an interlayer dielectric film that has first and second trenches on first and second regions of a substrate, respectively, forming a first metal layer along a sidewall and a bottom surface of the first trench and along a top surface of the interlayer dielectric film in the first region, forming a second metal layer along a sidewall and a bottom surface of the second trench and along a top surface of the interlayer dielectric film in the second region, forming a first sacrificial layer pattern on the first metal layer such that the first sacrificial layer fills a portion of the first trench, forming a first electrode layer by etching the first metal layer and the second metal layer using the first sacrificial layer pattern, and removing the first sacrificial layer pattern.

20 Claims, 16 Drawing Sheets

METHOD OF MANUFACTURING SEMICONDUCTOR DEVICE

CROSS-REFERENCE TO RELATED APPLICATION

Korean Patent Application No. 10-2011-0067900 filed on Jul. 8, 2011, in the Korean Intellectual Property Office, and entitled "Method of Manufacturing Semiconductor Device," is incorporated by reference herein in its entirety.

BACKGROUND

As an integration density of semiconductor devices increases, pattern forming unit devices of semiconductor devices are gradually down-sized and gate lengths of transistors are also reduced. Non-memory and logic devices may be based on high performance transistors capable of rapidly operating at a low voltage.

SUMMARY

Embodiments may be realized by providing a method of manufacturing a semiconductor device that includes providing a substrate having first and second regions defined thereon, forming an interlayer dielectric film on the substrate and the interlayer dielectric film includes first and second trenches on the first and second regions of the substrate, respectively, forming a first metal layer along a sidewall and a bottom surface of the first trench and along a top surface of the interlayer dielectric film in the first region, forming a second metal layer along a sidewall and a bottom surface of the second trench and along a top surface of the interlayer dielectric film in the second region, forming a first sacrificial layer pattern on the first metal layer such that the first sacrificial layer fills a portion of the first trench, forming a first electrode layer by etching the first metal layer and the second metal layer using the first sacrificial layer pattern, and removing the first sacrificial layer pattern.

Forming the first sacrificial layer pattern may include forming the first sacrificial layer pattern on the first metal layer such that the first sacrificial layer pattern fills a portion of the first trench, forming a second sacrificial layer pattern on the second metal layer such that the second sacrificial layer pattern fills a portion of the second trench, and removing the second sacrificial layer pattern such that the first sacrificial layer pattern remains in the first trench.

Forming the first and second sacrificial layer patterns may include forming a sacrificial layer over the first and second metal layers using a coating process, and etching the sacrificial layer so as to expose top portions of the first and second metal layers formed on the sidewalls of the first and second trenches, respectively, such that the first and second sacrificial layer patterns are formed.

While forming the first sacrificial layer pattern, a second sacrificial layer may be formed. The second sacrificial layer may be formed on the second metal layer such that the second sacrificial layer fills a portion of the second trench. Forming the first electrode layer may include etching the first and second metal layers using the first and second sacrificial layer patterns, respectively, forming a mask pattern on the first sacrificial layer pattern, removing the second sacrificial layer pattern and remaining portions of the second metal layer, and removing the mask pattern and removing the first sacrificial layer pattern to form the first electrode layer.

Removing the first sacrificial layer pattern may include performing etching using an etching solution that excludes hydrogen fluoride. The first sacrificial layer pattern may include a siloxane, and the etching solution may contain an alkylammonium hydroxide. The first and second regions may form a P-type metal-oxide-semiconductor region and an N-type metal-oxide-semiconductor region, respectively. The first electrode layer may be formed at the bottom surface of the first trench and along a portion of the sidewall of the first trench.

The method may include forming a second electrode layer filling the first and second trenches. The second electrode layer may be formed on the first electrode layer. The first and second metal layers may be made of a same material. The first and second trenches may be interconnected to each other. The method may include forming an insulating layer in the first and second trenches and below the first and second metal layers.

Embodiments may also be realized by providing a method of manufacturing that includes forming an interlayer dielectric film on a substrate such that the interlayer dielectric film includes a trench, forming an insulating layer along a sidewall and a bottom of the trench and along a top surface of the interlayer dielectric film, forming a metal layer on the insulating layer along the sidewall and the bottom of the trench and along the top surface of the insulating layer, forming a sacrificial layer pattern that includes a siloxane and the sacrificial layer pattern is formed to fill a portion of the trench and is formed on the metal layer, forming a first electrode layer by etching the metal layer using the sacrificial layer pattern, and removing the sacrificial layer pattern using an etching solution that excludes hydrogen fluoride.

The trench may include a first trench and a second trench. The metal layer may include a first metal layer formed in the first trench and a second metal layer formed in the second trench. The first electrode layer may be completed by partially removing the first metal layer and entirely removing the second metal layer. The method may include forming a second electrode layer that fills the second trench on the insulating layer in the second trench.

Embodiments may also be realized by providing a method of manufacturing a semiconductor device that includes providing a substrate having first and second regions defined thereon, forming an interlayer dielectric film on the substrate, the interlayer dielectric film including first and second trenches on the first and second regions of the substrate, respectively, forming a metal layer on the substrate, the metal layer includes a first metal layer in the first region and a second metal layer in the second region, forming a sacrificial layer pattern on the first metal layer such that the sacrificial layer is on the first metal layer and fills a portion of the first trench, the sacrificial layer is excluded in the second region, removing portions of the metal layer after forming the sacrificial layer pattern such that a part of the first metal layer remains under the sacrificial layer pattern, and removing the sacrificial layer pattern using an etching solution that excludes hydrogen fluoride such that a first electrode layer is formed. The first electrode layer corresponds to the part of the first metal layer remaining in the first trench.

During the removal of the portions of the metal layer, the second metal layer may be completely removed using the sacrificial layer pattern as an etching mask. During the removal of the portions of the metal layer, the part of the first metal layer remaining under the sacrificial layer pattern may cover a bottom surface and a partial portion of a sidewall of the first trench, and other parts of the first metal layer may be removed.

An uppermost surface of first electrode layer may be lower than an uppermost surface of the interlayer dielectric film.

The method may include, after removing the sacrificial layer pattern, forming second electrode layers in the first and second trenches, respectively, such that the first trench includes the first and second electrode layers.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
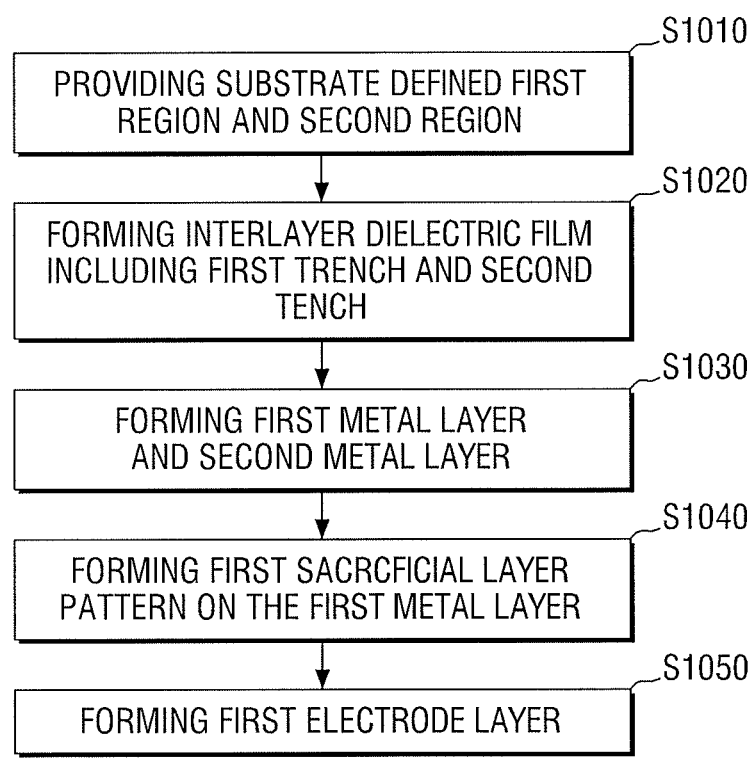
FIG. 1 illustrates a flowchart of a method of manufacturing a semiconductor device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the exemplary embodiments and are not a limitation on the scope of the invention unless otherwise specified.

Embodiments will be described with reference to perspective views, cross-sectional views, and/or plan views. The profile of an exemplary view may be modified according to, e.g., manufacturing techniques and/or allowances. Accordingly, the exemplary embodiments are not intended to limit the scope, but cover all changes and modifications that can be caused due to, e.g., a change in manufacturing process. Thus, regions shown in the drawings are illustrated in schematic form and the shapes of the regions are presented simply by way of illustration and not as a limitation.

Figure 3:
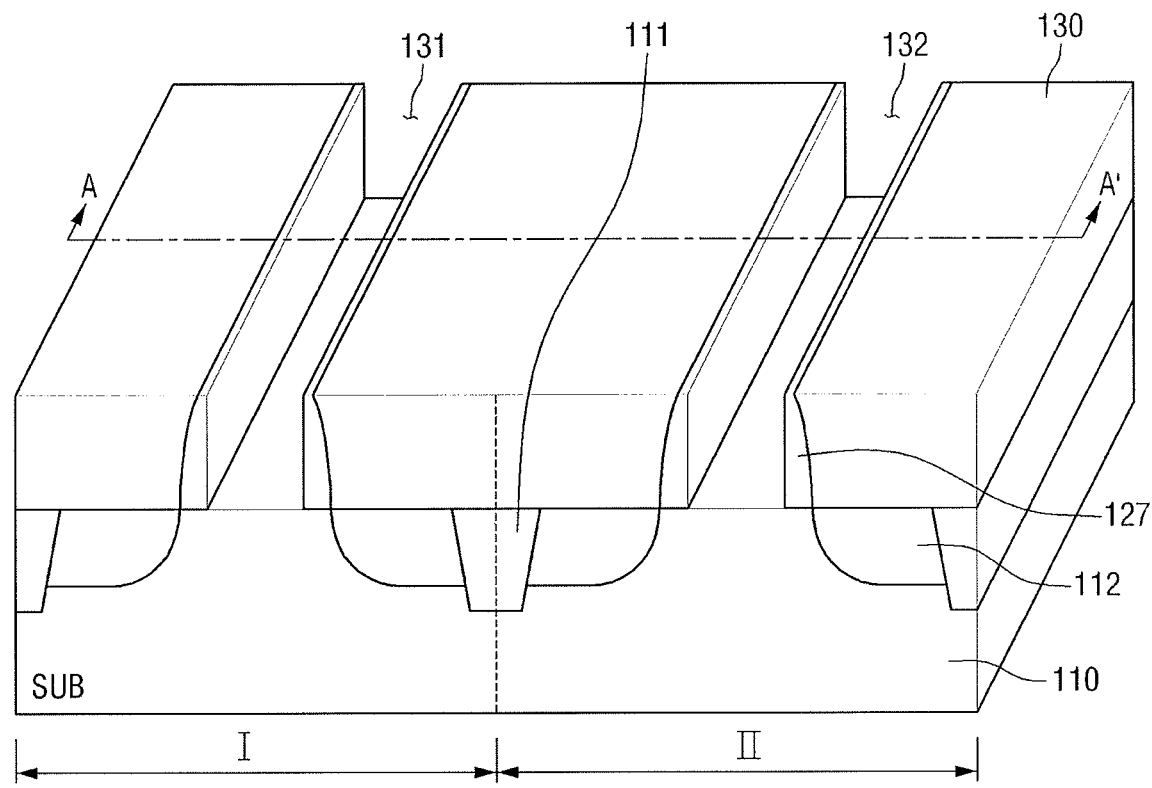
Figure 4:
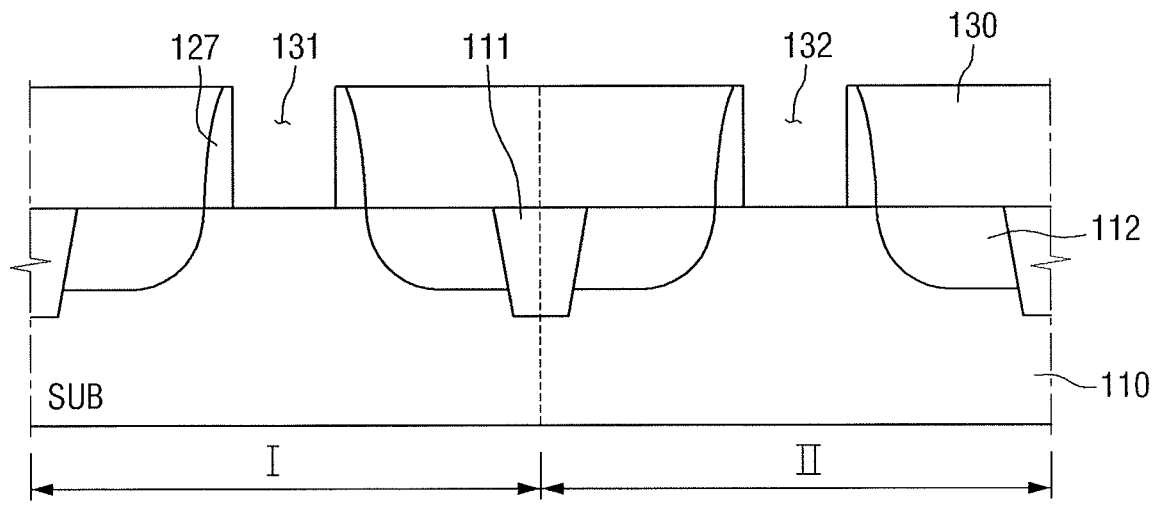

Hereinafter, a method of manufacturing a semiconductor device according to an exemplary will be described with reference to FIGS. 1 through 14. FIG. 1 illustrates a flowchart of a method of manufacturing a semiconductor device according to a first exemplary embodiment. FIGS. 2 and 5 through 14 illustrate cross-sectional views of intermediate structures for explaining the manufacturing method shown in FIG. 1. FIG. 3 illustrates a perspective view for explaining the manufacturing shown in FIG. 1, and FIG. 4 illustrates a cross-sectional view taken along line A-A' of FIG. 3.

Figure 2:
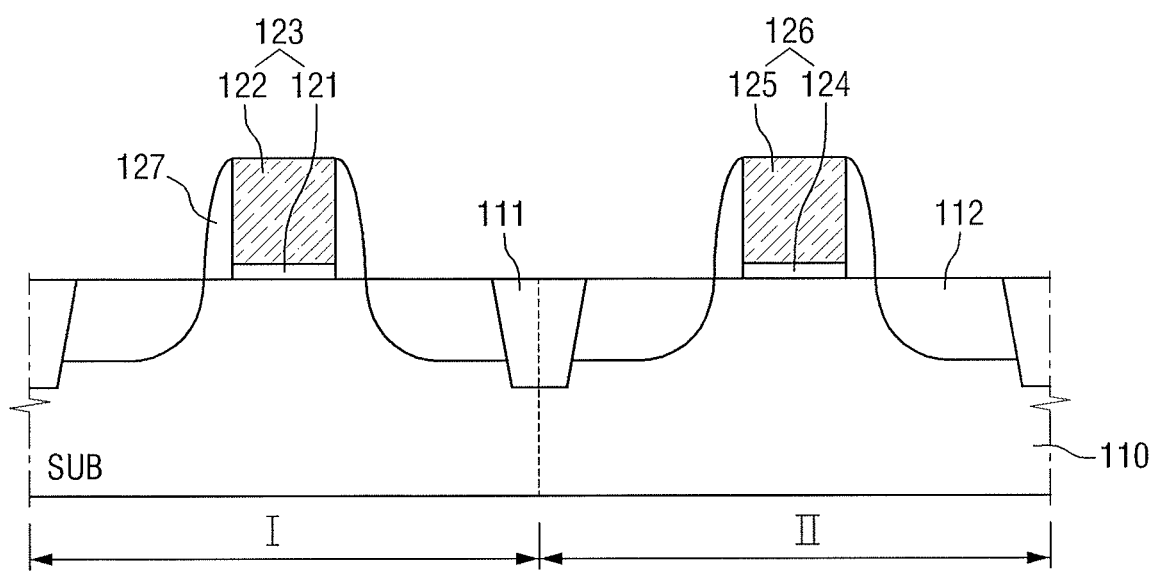
FIGS. 2 through 14 illustrate a perspective view and cross-sectional views of intermediate structures for explaining the manufacturing method shown in FIG. 1.

First, referring to FIGS. 1 and 2, a substrate 110 having first and second regions I and II defined thereon is provided (S1010).

The substrate 110 may include a rigid substrate such as a silicon substrate, a silicon on insulator (SOI) substrate, a gallium arsenide substrate, a silicon germanium substrate, a ceramic substrate, a quartz substrate, or a glass substrate for display, or a flexible plastic substrate such as a polyethylene terephthalate, a polymethylmethacrylate, a polyimide, polycarbonate, a polyethersulfone, or a polyethylene naphthalate.

Referring to FIG. 2, an isolation region 111 for defining an active region may be formed on the substrate 110. The isolation region 111 may be, e.g., a field oxide layer (FOX) formed using a local oxidation of silicon (LOCOS) method or shallow trench isolation (STI). The isolation region 111 may be formed of a silicon oxide layer. For example, the isolation region 111 may be formed of an undoped silicate glass (USG), a boron doped silicate glass (BSG), a phosphorous silicate glass (PSG), a boro-phosphorous silicate glass (BPSG), a spin on glass (SOG) oxide, or a high density plasma (HDP) oxide.

The substrate 110 may have formed thereon the first regions I and the second region II. According to an exemplary embodiment, the first regions I and the second region II may be a P-type Metal-Oxide-Semiconductor (PMOS) region and an N-type MOS (NMOS) region, respectively, or vice versa.

Referring to FIGS. 1 and 2 through 4, an interlayer dielectric film 130, which includes first and second trenches 131 and 132 extending therethrough, may be formed on the substrate 110 (S1020).

The first and second trenches 131 and 132 may be formed by removing dummy gate patterns from the interlayer dielectric film 130. For example, referring to FIG. 2, before forming the interlayer dielectric film 130, first and second dummy gate patterns 123 and 126 may be formed on the first and second regions I and II, respectively, of the substrate 110. Formation of the first and second dummy gate patterns 123 and 126 may include sequentially stacking an insulating layer for a dummy gate insulating layer and a conductive layer for a dummy gate electrode on the first and second regions I and II of the substrate 110. For example, the insulating layer and the conductive layer may be formed to cover the substrate 110.

Then, the method may include forming a photoresist pattern or insulating pattern for a mask which defines a region for forming a dummy gate pattern on the conductive layer, etching the insulating layer for a dummy gate insulating layer and the conductive layer for a dummy gate electrode using the photoresist pattern (or the insulating pattern) as a mask, and removing the photoresist pattern so as to complete the first and second dummy gate patterns 123 and 126.

The first dummy gate pattern 123 may include a first dummy gate insulating layer 121 and a first dummy gate electrode 122. The second dummy gate pattern 126 may include a second dummy gate insulating layer 124 and a second dummy gate electrode 125. The first dummy gate insulating layer 121 and the second dummy gate insulating layer 124 may be formed of a silicon oxide layer, a silicon nitride layer or a combination thereof using thermal oxidation, chemical vapor deposition (CVD), physical vapor deposition (PVD) or atomic layer deposition (ALD). The first and second dummy gate electrodes 122 and 125 may be formed of polysilicon Referring to FIG. 2, spacers 127 may be formed along sidewalls of the first and second dummy gate patterns 123 and 126, e.g., to cover entire lateral sides thereof Formation of the spacers 127 may include conformally depositing an insulating layer for a spacer along a profile of the substrate 110 having the dummy gate patterns 123 and 126 formed thereon and anisotropically etching the insulating layer to form the spacers 127 on the sidewalls of the first and second dummy gate patterns 123 and 126.

The spacers 127 may be made of a material having high etching selectivity with respect to the first and second dummy gate patterns 123 and 126. For example, the spacers 127 may be made of a silicon nitride. After forming the spacers 127, impurity ions may be injected, e.g., using the first and second dummy gate patterns 123 and 126 and the spacers 127 as a mask, to form source/drain regions 112 in the substrate 110.

Referring to FIGS. 3 and 4, the interlayer dielectric film 130 may be formed over the substrate 110 to fill spaces between the first and second dummy gate patterns 123 and 126. For example, the interlayer dielectric film 130 may be formed by depositing a silicon oxide layer over the substrate 110 having the first and second dummy gate patterns 123 and 126 thereon. The interlayer dielectric film 130 may be formed by using chemical vapor deposition (CVD), physical vapor deposition (PVD), or atomic layer deposition (ALD). An top or uppermost surface of the interlayer dielectric film 130 may be higher than top or uppermost surfaces of the first and second dummy gate patterns 123 and 126, e.g., so that the first and second dummy gate patterns 123 and 126 are buried under the interlayer dielectric film 130 (not shown).

After forming the interlayer dielectric film 130, the first and second gate patterns 123 and 126 may be stripped and/or removed to form the first and second trenches 131 and 132, respectively. The spacers 127 may remain adjacent to the trenches 131 and 132. For example, after planarizing the interlayer dielectric film 130 until the top surfaces of the first and second dummy gate patterns 123 and 126 are exposed, the first and second dummy gate patterns 123 and 126 may be selectively removed to form the first and second trenches 131 and 132. The first and second dummy gate insulating layers 121 and 124 and the first and second dummy gate electrodes 122 and 125 may be removed. At least a portion of the first and second dummy gate insulating layers 121 and 124 may remain on the substrate 110, according to an exemplary embodiment.

The first and second trenches 131 and 132 may extend in a first direction, e.g., the first direction may be substantially perpendicular to the substrate 110. The first and second trenches 131 and 132 may be formed on the first and second regions I and II of the substrate 110, respectively. For example, the planarization of the interlayer dielectric film 130 may be performed using chemical mechanical polishing (CMP) or etch back.

Although FIG. 3 shows the first and second dummy gate patterns 123 and 126 are selectively etched to expose a top surface of the substrate 110, the first and second dummy gate insulating layers 121 and 124 may be left on the substrate 110. The first and second dummy gate patterns 123 and 126 may be removed by reactive ion etching (RIE) or wet etching with an aqueous solution including ammonia.

Figure 5:
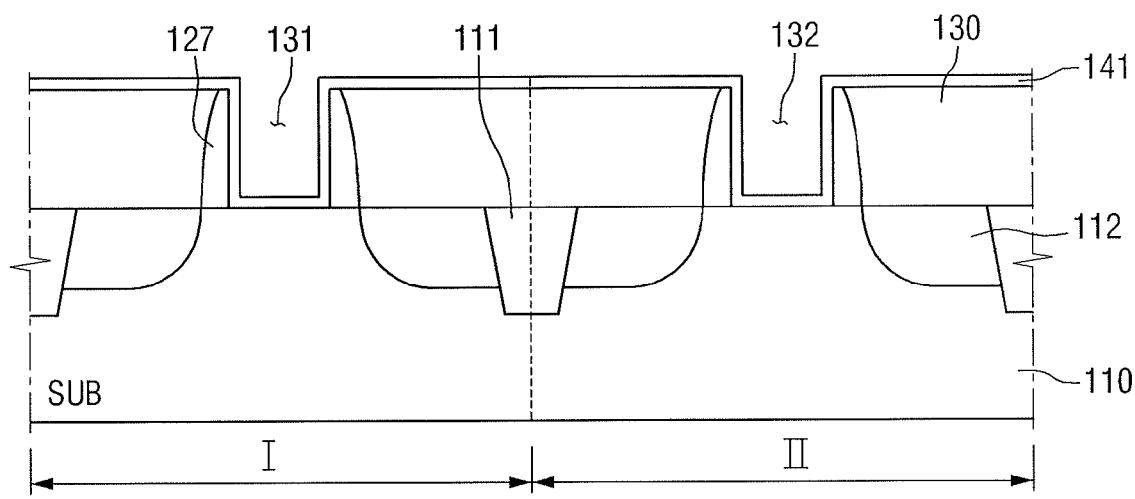
Figure 6:
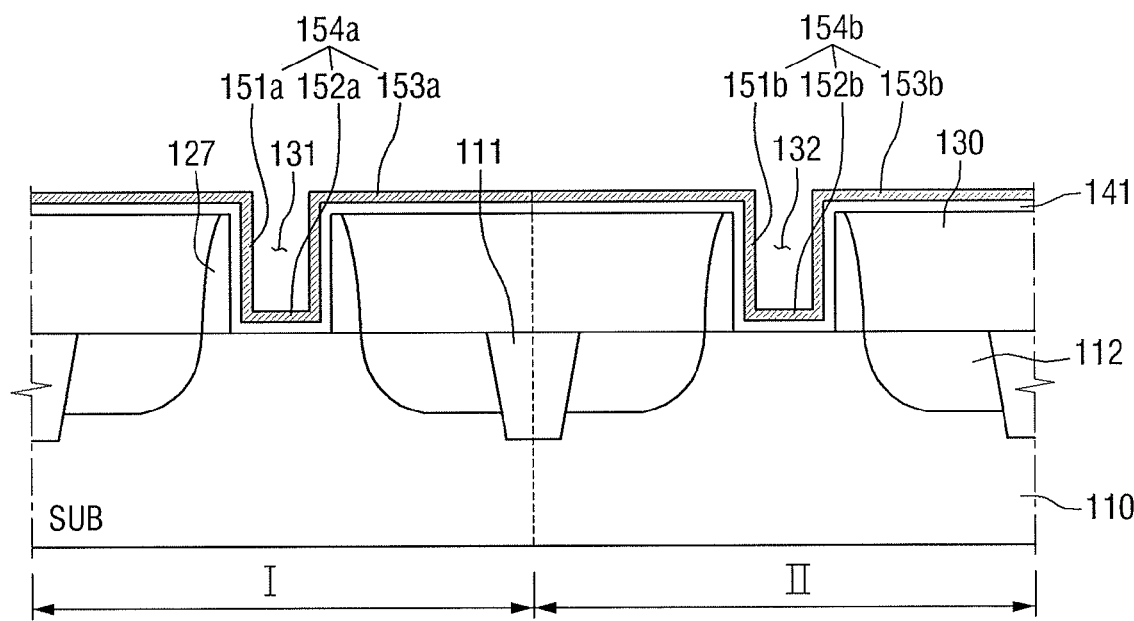

Referring to FIGS. 1, 5, and 6, first and second metal layers 154a and 154b may be formed within the first and second trenches 131 and 132, respectively (S1030). The first and second metal layers 154a and 154b may be portions of at least one continuous metal layer formed on the substrate 110.

First, referring to FIG. 5, before forming the first and second metal layers 154a and 154b, an insulating layer 141 may be formed within the first and second trenches 131 and 132, respectively. For example, the insulating layer 141 may deposited conformally, e.g., as one continuous layer, along a profile of the substrate 110 having thereon the interlayer dielectric film 130 including the first and second trenches 131 and 132 by using, e.g., CVD, PVD, or ALD. The insulating layer 141 may be formed of a silicon oxide, a high-k dielectric material having a higher dielectric constant than silicon oxide, or a mixture thereof. Examples of the high-k dielectric material may include, but are not limited to, at least one selected from a hafnium oxide, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, a lead scandium tantalum oxide, and a lead zinc niobate (either alone or in a mixture thereof).

When the first and second dummy gate insulating layers 121 and 124 remain on the substrate 110 during removal of the first and second dummy gate patterns 123 and 126, a separate insulating layer 141 does not need to be formed. For example, the first and second dummy gate insulating layers 121 and 124 may act as the insulating layer 141. Alternatively, both the insulating layer 141 may be formed and at least portions of the first and second dummy gate insulating layers 121 and 124 may remain on the substrate 110.

Referring to FIG. 6, the first and second metal layers 154a and 154b may then be formed within the first and second trenches 131 and 132 using, e.g., CVD, PVD, ALD, or sputtering. For example, the first metal layer 154a may include a first side metal layer 151a formed along sidewalls of the first trench 131, a first bottom metal layer 152a formed at a bottom surface of the first trench 131, and a first top metal layer 153a formed on the interlayer dielectric film 130 disposed on the first region I of the substrate 110 and surrounding the first trench 131. The first side metal layer 151a, the first bottom metal layer 152a, and the first top metal layer 153a may be one continuous layer conformally formed on the interlayer dielectric film 130, e.g., directly on an insulating layer such as the insulating layer 141.

The second metal layer 154b may include a second side metal layer 151b formed along sidewalls of the second trench 132, a second bottom metal layer 152b formed at a bottom of the second trench 132, and a second top metal layer 153b formed on the interlayer dielectric film 130 disposed on the second region II of the substrate 110 and surrounding the second trench 132. The second side metal layer 151b, the second bottom metal layer 152b, and the second top metal layer 153b may be one continuous layer conformally formed on the interlayer dielectric film 130, e.g., directly on an insulating layer such as the insulating layer 141.

The first and second metal layers 154a and 154b may be formed of a conductive material having a work function suitable for a transistor. For example, when a transistor is an NMOS transistor, the first and/or second metal layers 154a and 154b may be formed of a conductive material with a work function that is closer to the bottom portion of the conduction band of a semiconductor that forms the substrate 110 than the top portion of the valence band. In contrast, when a transistor is a PMOS transistor, the first and/or second metal layers 154a and 154b may be formed of a conductive material with a work function that is closer to the top portion of the valance band of a semiconductor that forms the substrate 110 than the bottom portion of the conduction band.

For example, the first and/or second metal layers 154a and 154b may be formed of at least one selected from nickel, ruthenium, ruthenium oxide, molybdenum, molybdenum nitride, molybdenum silicide, tantalum, tantalum nitride, tantalum silicide, tungsten, titanium, titanium nitride, and n- and p-type doped polysilicon, either alone or in mixture, but not limited thereto. In addition, the first and/or second metal layers 154a and 154b may be formed of a single layer or a multiple layer structure of two or more layers. FIG. 6 illustrates an example of a structure in which the first and second metal layers 154a and 154b are formed of titanium nitride (TiN) when the first and second regions I and II are a PMOS region and a NMOS region, respectively.

Figure 7:
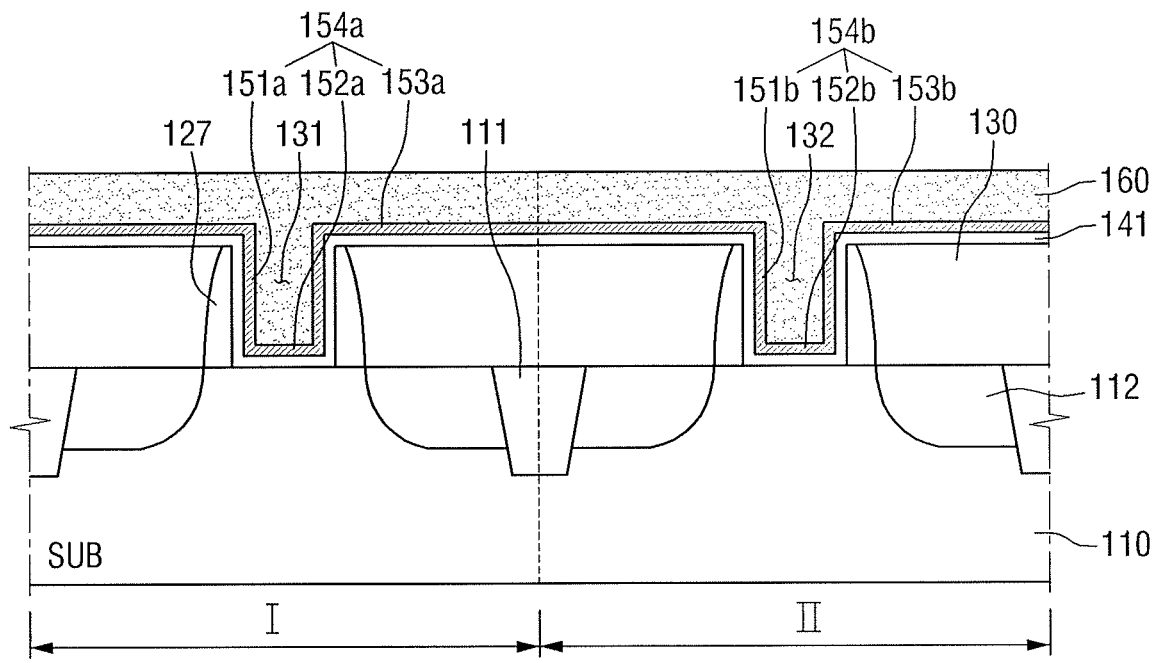

Referring to FIGS. 1 and 7 through 11, a sacrificial layer pattern 161 may be formed on the first metal layer 154a (S1040). For example, as shown in FIG. 7, a sacrificial layer 160 may first be formed on the substrate 110 having thereon the first and second trenches 131 and 132. The sacrificial layer 160 may fill, e.g., completely fill, the first trench 131 and the second trench 132. The sacrificial layer 160 may also be formed to overlap an upper surface of the interlayer dielectric film 130, e.g., so as to form one continuous layer that fills both the first trench 131 and the second trench 132.

The sacrificial layer 160 may be formed of, e.g., a material having a high etch selectivity greater than 3:1 with respect to the first and second metal layers 154a and 154b. When the etch selectivity is in the above range, the sacrificial layer 160 may be mainly etched and/or only etched during subsequent etching processes while the first and second metal layers 154a and 154b remain intact. The sacrificial layer 160 may contain a siloxane, e.g., the sacrificial layer 160 may be a siloxane layer that is formed or entirely formed of at least one siloxane. For example, the sacrificial layer may include an organosiloxane polymer such as polydimethylsiloxane or polyether siloxane copolymer. According to an exemplary embodiment, a material containing siloxane polymer may be coated over the substrate 110 to form the sacrificial layer 160. The coating may be formed using, e.g., spin coating, roll coating, flow coating, spray coating, or slot die coating.

Figure 8:
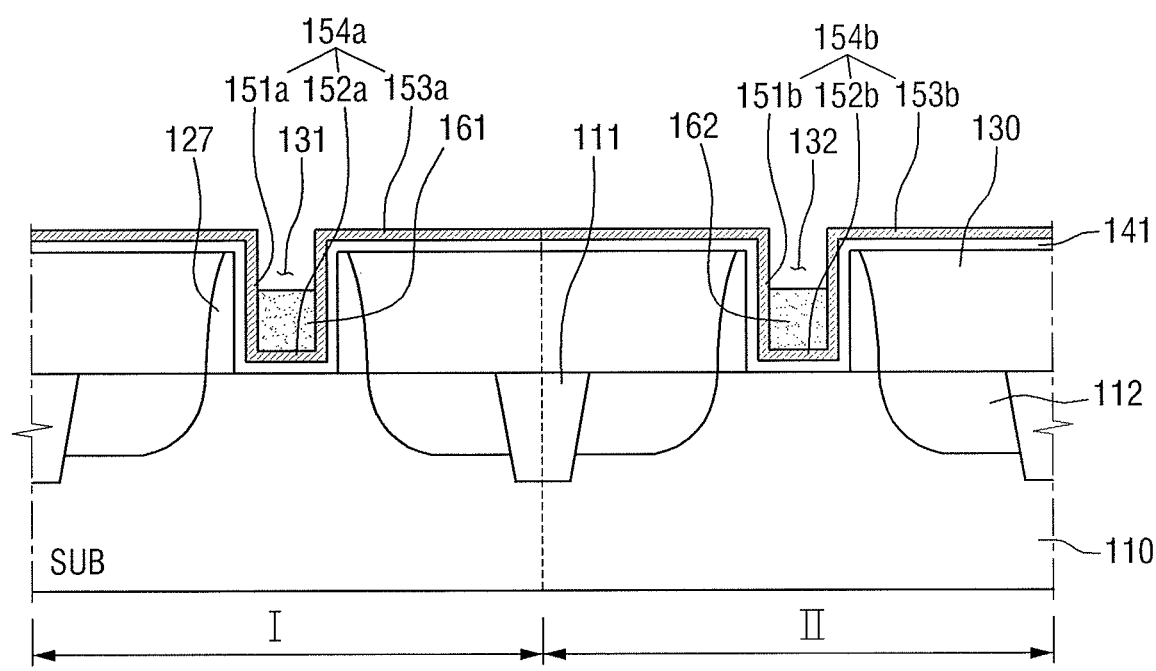

Referring to FIG. 8, the sacrificial layer 160 may be etched to form first and second sacrificial layer patterns 161 and 162 that fill portions, e.g., only bottom portions, of the first and second trenches 131 and 132, respectively. For example, the sacrificial layer 160 may be etched back such that top surfaces of the first and second sacrificial layer patterns 161 and 162 are lower than the top surface of the interlayer dielectric film 130. The etching may be performed, e.g., using a solution without hydrogen fluoride (HF), such as a solution containing alkylammonium hydroxide. Accordingly, the solution used for etching may exclude hydrogen fluoride.

Using the solution, e.g., that contains alkylammonium hydroxide, the sacrificial layer 160 may be etched to form the first sacrificial layer pattern 161 that partially exposes sides of the first side metal layer 151a and entirely exposes the first top metal layer 153a. The first bottom metal layer 152a may be covered, e.g., completely covered, by the first sacrificial layer pattern 161. Further, a second sacrificial layer pattern 162 may be formed that partially exposes sides of the second side metal layer 151b and entirely exposes the second side metal layer 153b. The second bottom metal layer 152b may be covered, e.g., completely covered, by the second sacrificial layer pattern 162. Accordingly, portions of the surfaces, e.g., outermost surfaces, of the first and second side metal layers 151a and 151b may be exposed by the first and second sacrificial layer patterns 161 and 162, respectively. Other portions of the surfaces of the first and second metal layers 151a and 151b may be covered, e.g., in direct contact with, the first and second sacrificial layer patterns 161 and 162, respectively.

Figure 9:
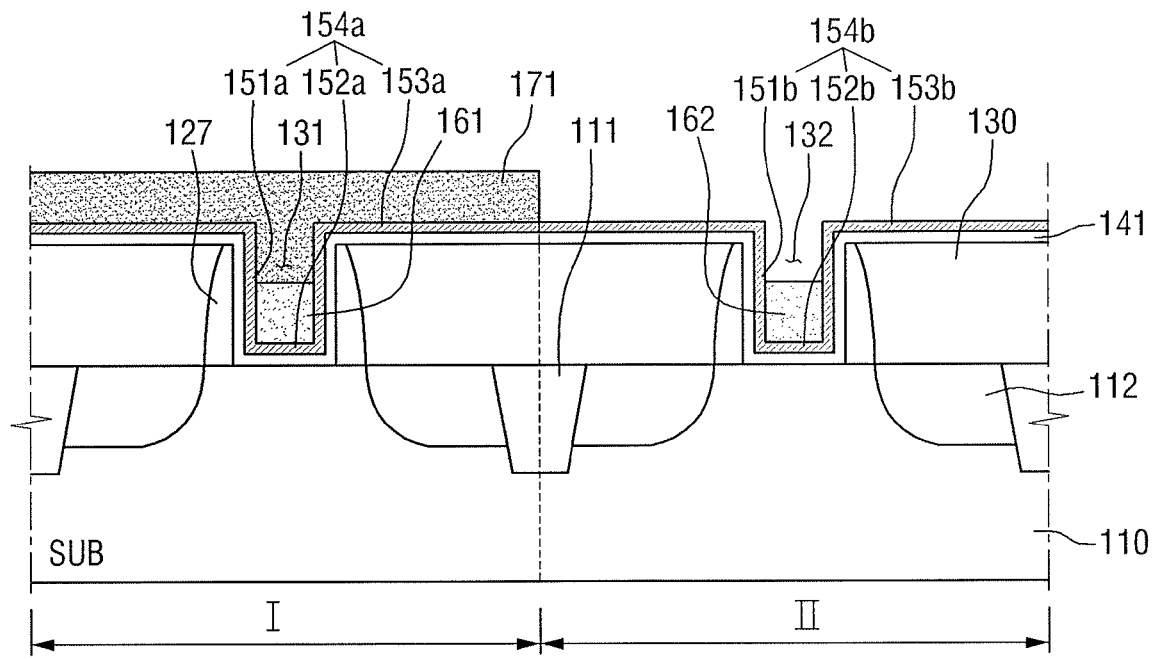

Referring to FIG. 9, a mask layer pattern 171 may be formed so as to cover the first region I of the substrate 110, e.g., to cover and/or entirely cover the first sacrificial layer pattern 161 and the first top metal layer 153a. For example, a mask layer filling the first and second trenches 131 and 132 may be formed over the substrate 110. The mask layer may be subjected to, e.g., photolithography, to create a mask layer pattern 171 that covers only the first region I of the substrate 110 so as the second region II of the substrate 110 is exposed, e.g., entirely exposed, by the mask layer pattern 171.

FIG. 9 illustrates an example of a structure in which the mask layer pattern 171 entirely covers the first region I of the substrate 110. However, according to another exemplary embodiment, the mask layer pattern 171 may be formed to fill the first trench 131 so as to be disposed only on the first sacrificial layer pattern 161, e.g., so that the first top metal layer 153a is exposed. The mask layer pattern may be formed of a silicon oxide, a silicon nitride, an organic material, a photoresist, or other materials.

Figure 10:
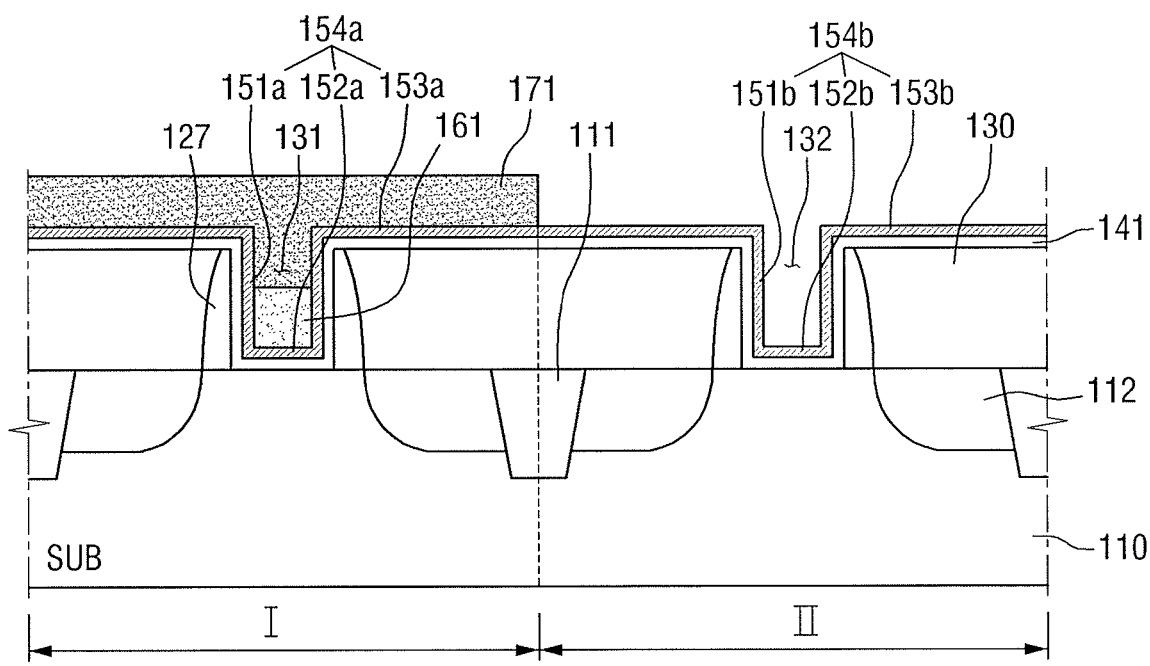
Figure 11:
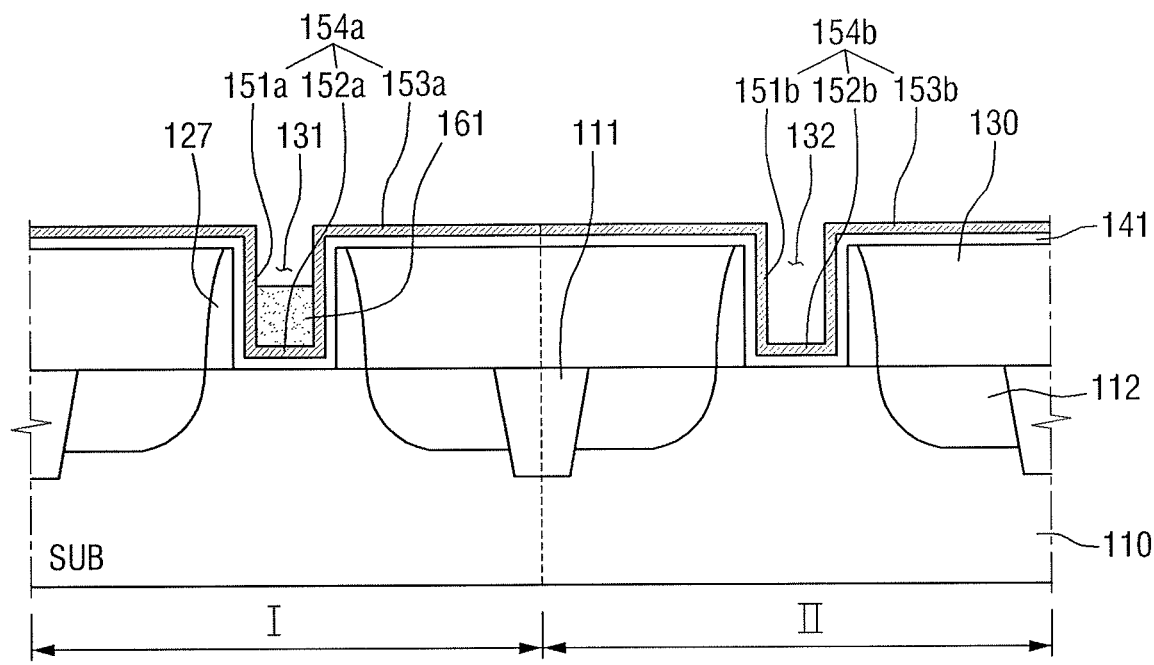

Referring to FIGS. 10 and 11, the second sacrificial layer pattern 162 from the second region II of the substrate may be removed using the mask layer pattern 171 to protect to the first sacrificial layer pattern 161 from being removed. Thereafter, the mask layer pattern 171 may be removed so as to expose the sacrificial layer pattern 161. According to an exemplary embodiment, the first sacrificial layer pattern 161 that remains after removal of the second sacrificial layer pattern 162 may become a final sacrificial layer pattern 161.

To remove the second sacrificial layer pattern 162, etching may be performed using the mask layer pattern 171 as a mask. For example, during the etching process, the first sacrificial layer pattern 161 may remain intact because of being covered with the mask layer pattern 171. In contrast, the second sacrificial layer pattern 162, which is exposed by the mask layer pattern 171, may be etched and may be completely removed.

Thus, the second metal layer 154b within the second trench 132 may be entirely exposed. The second sacrificial layer pattern 162 containing a siloxane may be removed by dry etching or wet etching using a solution without HF. For example, the solution may exclude HF while including other etchants. According to an exemplary embodiment, the second sacrificial layer pattern 162 may be removed using an etching solution containing alkylammonium hydroxide, whereas the solution completely excludes HF.

The sacrificial layer pattern 161 may be formed in the first trench 131 so as to expose portions of the sides of the first side metal layer 151a and cover the remaining portions thereof. Since the etching may be performed using a solution without HF, an underlying insulating layer such as the insulating layer 141 may be protected, e.g., may not be damaged, during the etching. The mask layer pattern 171 may be removed by an ashing or stripping process.

Referring to FIGS. 1, 11 trough 13, the first and second metal layers 154a and 154b may be etched to form a first electrode layer 154 in the first region I of the substrate 110 (S1050). For example, the second metal layer 154b may be removed and portions of the first metal layer 154a that are not covered by the sacrificial layer pattern 161 may be removed to form a first electrode layer 154 within a bottom portion of the first trench 131. The first electrode layer 154 may completely surround the sacrificial layer pattern 161.

Figure 12:
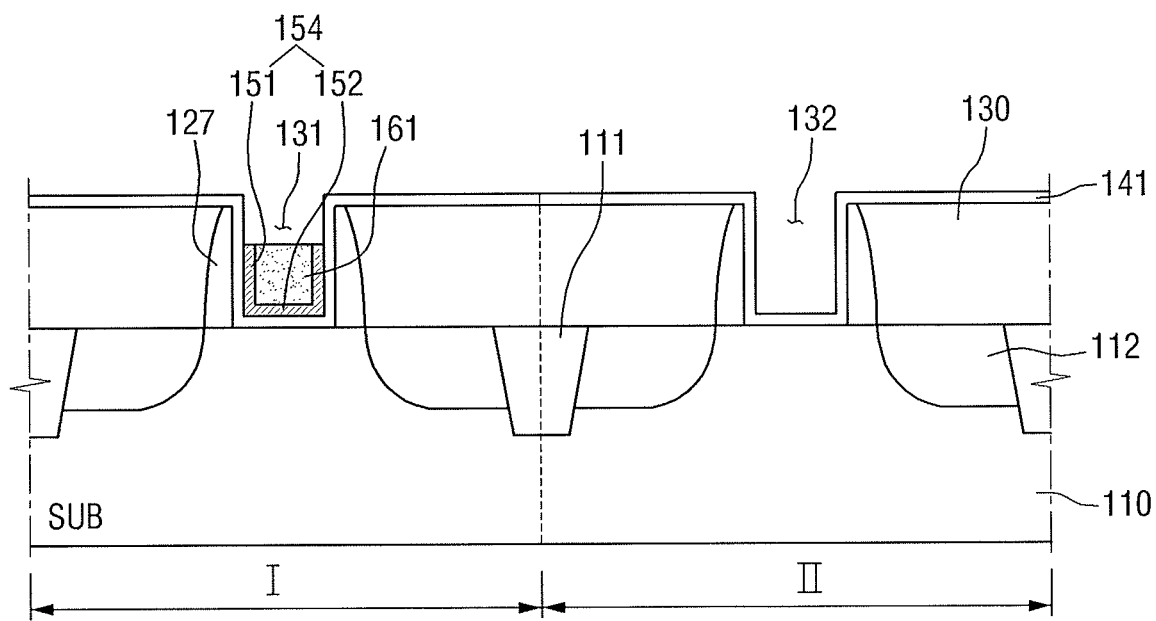

For example, referring to FIG. 11 and FIG. 12, dry etching or wet etching may be performed on the first and second metal layers 154a and 154b using the sacrificial layer pattern 161 as a mask, e.g., all portions not covered by the sacrificial layer pattern 161 may be removed. For example, the first and second metal layers 154a and 154b may be etched using an etching solution that is a mixture of, e.g., hydrogen peroxide ($H_2O_2$), deionized water and ammonia, or an etching solution containing $H_2O_2$. The second metal layer 154b and the first top metal layer 153a of first metal layer 154a may be entirely removed and the first side metal layer 151a of the first metal layer 154a may be partially removed. The first bottom metal layer 152a of the first metal layer 154a may not be removed.

In exemplary embodiments, the first and second metal layers 154a and 154b may be etched simultaneously to form the first electrode layer 154. In other words, the first and second metal layers 154a and 154b may be etched only once to form the first electrode layer 154 without additional etching processes, and the manufacturing process may be simplify and damage caused by etching may be reduced.

Figure 13:
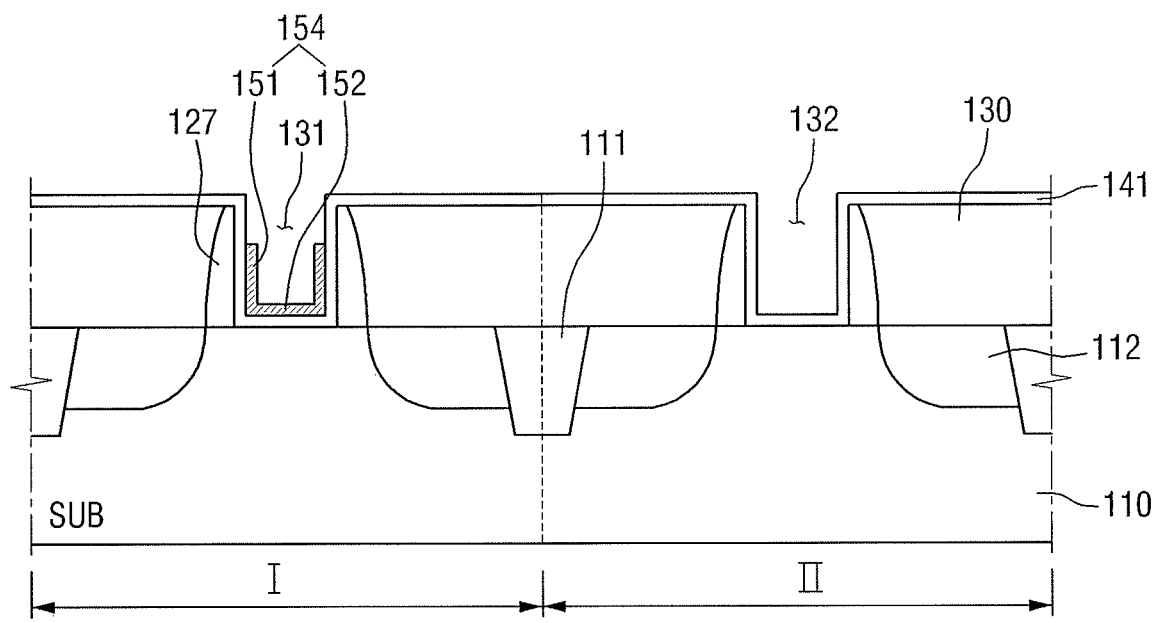

Referring to FIG. 13, the process of forming the first electrode layer 154 may be completed by removing the sacrificial layer pattern 161. For example, the sacrificial layer pattern 161 may be etched using an etching solution or gas so as to form the first electrode layer 154 in the trench 131. The etching solution or gas may exclude HF and may be an etching solution or gas containing alkylammonium hydroxide.

The first electrode layer 154 may include a first side electrode layer 151 formed along sidewalls of the first trench 131 and a first bottom electrode layer 152 formed at the bottom of the trench 131, e.g., on the bottom surface of the trench 131. The first electrode layer 154 may be formed directly on the first dummy gate insulating layer 121 that forms the insulating layer 141 or the separately formed insulating layer 141. The first side electrode layer 151 may be formed only on portions of the sidewalls of the trench 131, e.g., an upper portion of the sidewalls of the trench 131 may not be covered by the first electrode layer 154. An uppermost surface of the first electrode layer 154 may be at a lower level, e.g., closer to a top surface of the substrate 110, than the uppermost surface of the interlayer dielectric film 130.

Using an HF containing etching solution during etching of the sacrificial layer pattern 161 may result in etching of first metal layer 154a and the insulating layer 141 or affect their physical characteristics, thereby increasing a leakage current and degrading the device reliability. However, according to exemplary embodiments, since the sacrificial layer pattern 161 contains a siloxane, the sacrificial layer pattern 161 can be removed without using a material that contains HF. Because the sacrificial layer pattern 161 is removed using a material without HF, the physical characteristics of the first metal layer 154a and the insulating layer 141 in contact with the sacrificial layer pattern 161 may not be affected and/or substantially damaged during etching. This may eliminate an additional process of removing the insulating layer 141 and forming a new insulating layer after the etching. According to an exemplary embodiment, the insulating layer 141 may be used as a gate insulating layer by forming a gate electrode immediately on the insulating layer 141.

Figure 14:
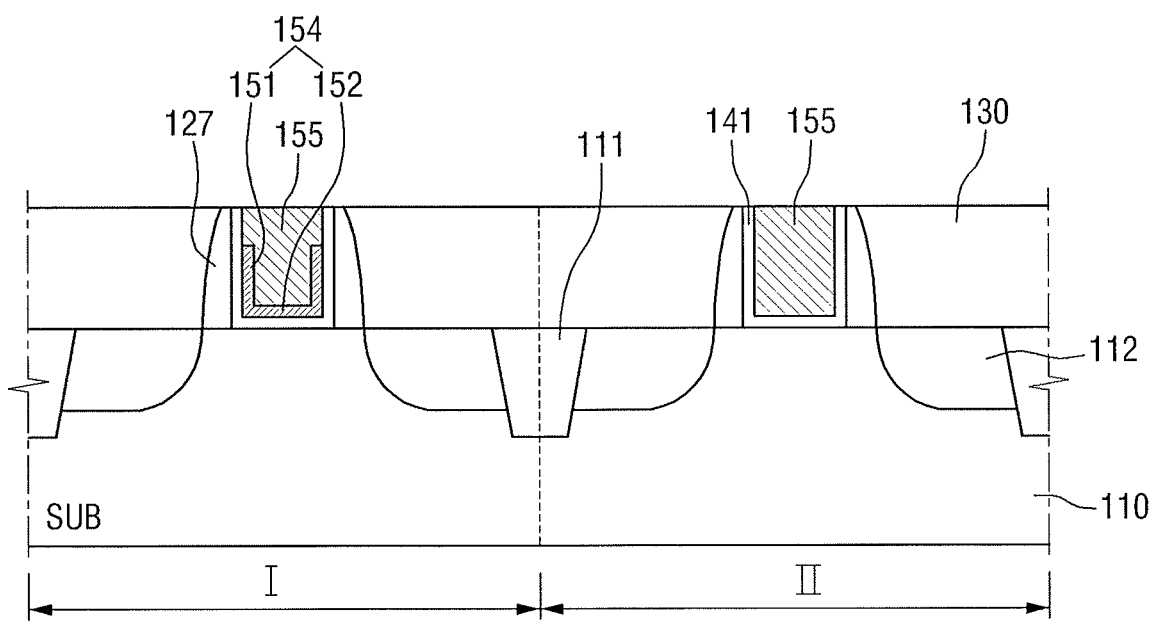

Referring to FIG. 14, a second electrode layer 155 filling the first and second trenches 161 and 162 may be then formed on the substrate 110. The second electrode layer 155 may be formed directly on the first electrode layer 154 in the first trench 131 so that the first electrode layer 154 surrounds the second electrode layer 155.

According to an exemplary embodiment, a conductive layer for a second electrode layer may be formed to a thickness to cover the interlayer dielectric film 130 while filling, e.g., completely filling unfilled portions of, the first and second trenches 131 and 132. A planarization process may then be performed on the conductive layer for forming the second electrode layer 155 until the top surface of the interlayer dielectric film 130 is exposed. Thereby, the second electrode layer 155 may be formed within, e.g., only within, the first and second trenches 131 and 132. The second gate metal layer forming conductive layer may be formed by, e.g., CVD, PVD, ALD or sputtering, and the planarization process may be performed by CMP. The second gate metal layer forming conductive layer may be formed of a material selected from aluminum, tungsten, molybdenum, titanium, tantalum, and copper, either alone or in mixture thereof.

In methods of manufacturing a semiconductor device according to exemplary embodiments, because the first electrode layer 154 may be formed by removing a portion of the first metal layer 154a formed in the first trench 131 using the sacrificial layer pattern 161, a volume of the second electrode layer 155 to be embedded in the first and second trenches 131 and 132 is increased by the amount of the first metal layer 154a removed therefrom. This may reduce the resistance of the second electrode layer 155 and allow more uniform deposition of the second electrode layer 155.

To adjust a work function, the first electrode layer 154 may be formed on only one of the first and second regions I and II of the substrate 110. Although the first electrode layer 154 is embedded only in the first trench 131, it may also be formed in the second trench 132 by a person skilled in the art. To also adjust a work function, a metal layer may be further formed above or below the first electrode layer 154. Although not shown in the drawings, if a lower electrode layer additionally underlies the first electrode layer 154, the first and second metal layers 154a and 154b may be etched using a material having a high etch selectivity with respect to the lower electrode layer to complete the first electrode layer 154. In this case, after the second metal layer 154b is removed, the lower electrode layer may be exposed instead of the insulating layer 141.

Figure 15:
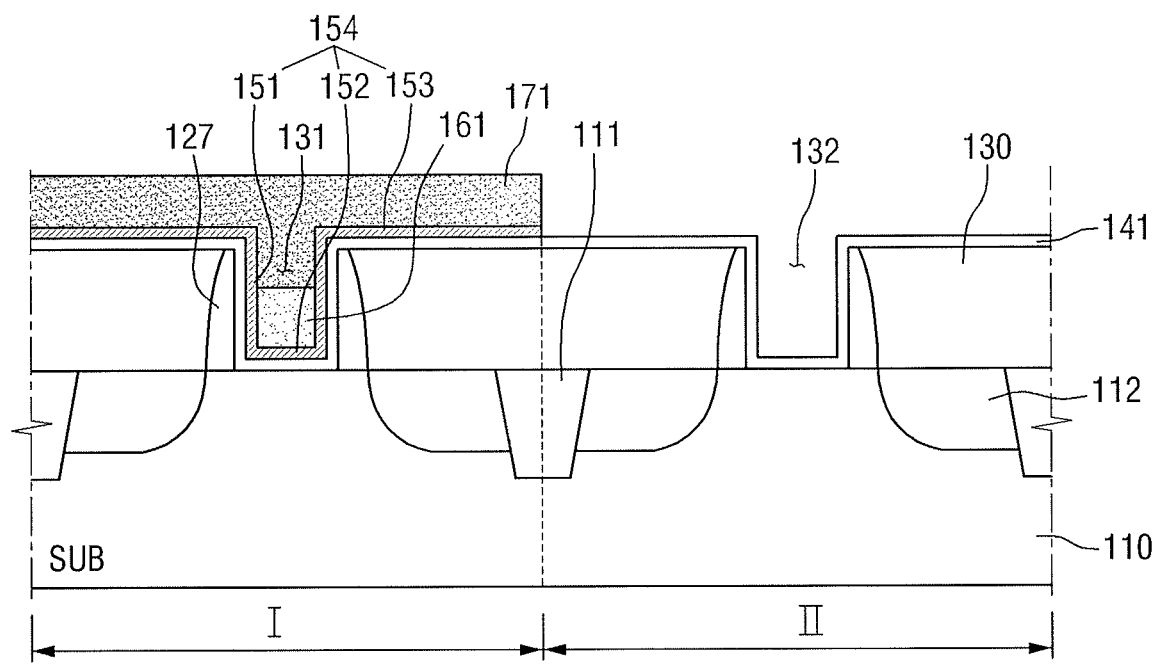
FIGS. 15 through 17 illustrate cross-sectional views of intermediate structures for explaining a method of manufacturing a semiconductor device according to an exemplary embodiment.
Figure 16:
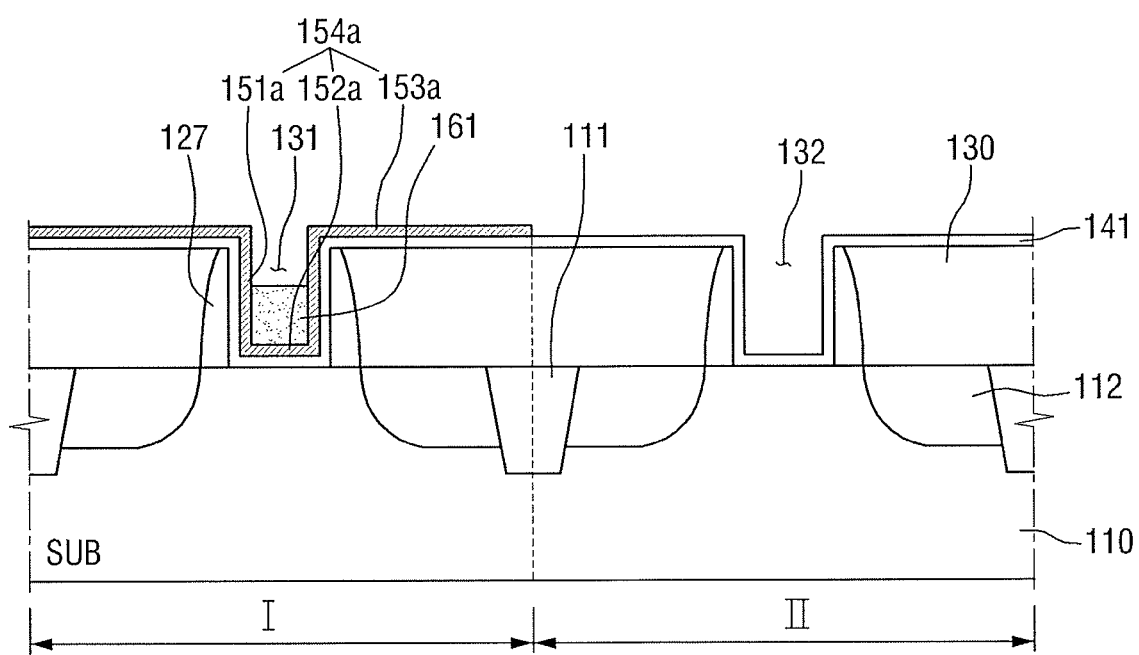
Figure 17:
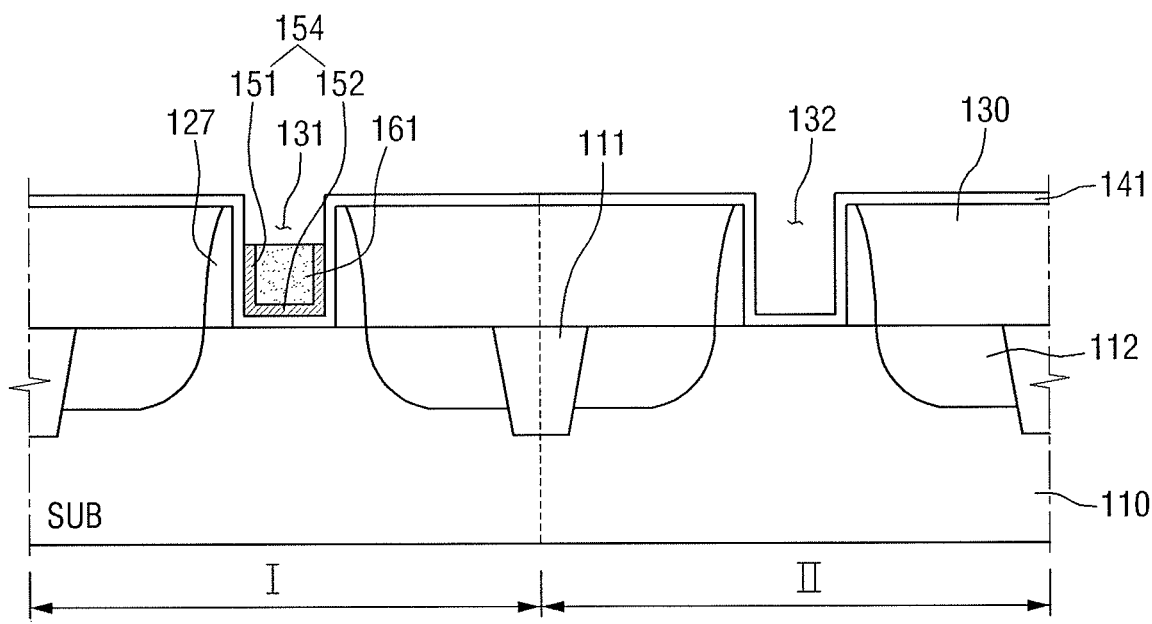

A method of manufacturing a semiconductor device according to a second exemplary embodiment will now be described with reference to FIG. 8 and FIGS. 15 through 17. FIGS. 15 through 17 illustrate cross-sectional views of intermediate structures for explaining a method of manufacturing a semiconductor device according to the second exemplary embodiment. In FIGS. 15 through 17, substantially the same components as those in FIGS. 2 to 14 are denoted by the same reference numerals and detailed descriptions thereof will not be given. Parts of the manufacturing method of the semiconductor device according to the second embodiment is different from the manufacturing method of the semiconductor device according to the first embodiment in view of processes corresponding to those shown in FIG. 9 and FIG. 10, and these differences are mainly described below.

Referring to FIG. 8 and FIG. 15, a mask layer pattern 171 may be formed on a first region I of a substrate 110, and a second sacrificial layer pattern 162 and a second metal layer 154b formed on a second region II are sequentially removed while the mask layer pattern 171 remains on the first region I.

For example, the mask layer pattern 171 may be formed by photography so as to cover a first sacrificial layer pattern 161, followed by etching using an etching solution without HF to remove of the second sacrificial layer pattern 162. The second sacrificial layer pattern 162 may be removed to expose a surface of the second metal layer 154b. Further, the second metal layer 154b may be entirely removed. Accordingly, the second sacrificial layer pattern 162 and the second metal layer 154b may be removed using the mask layer pattern 171 overlying the first region I of the substrate 110, and the first sacrificial layer pattern 161 and the first metal layer 154a may be removed after forming the mask layer pattern 171, as needed by a person skilled in the art.

Referring to FIG. 16, the mask layer pattern 171 may be removed. For example, the mask layer pattern 171 may be etched back to expose the first metal layer 154a and a top surface of the sacrificial layer pattern 161 formed in the first trench 131. The first top metal layer 153a may be entirely exposed and the first side metal layer 151a formed along sidewalls of the first trench 131 may be partially exposed while the remaining portion of the first side metal layer 151a may not be exposed by the sacrificial layer pattern 161.

Referring to FIG. 17, the first metal layer 154a may be etched to form a first electrode layer 154. For example, the exposed first metal layer 154a may be etched using the sacrificial layer pattern 161 as a mask, and the sacrificial layer pattern 161 may be removed, thereby completing the first electrode layer 154. The first metal layer 154a may be etched using an etching solution that is, e.g., a mixture of $H_2O_2$, deionized water and ammonia, or an etching solution containing $H_2O_2$. The sacrificial layer pattern 161 may be etched using a solution without HF such as a solution containing alkylammonium hydroxide.

The first top metal layer 153a may be entirely etched and removed, and the first side metal layer 151a may be partially etched and removed to form the first electrode layer 154 in the first trench 131. The first electrode layer 154 may include a side electrode layer 151 and a bottom electrode layer 152 formed in the first trench 131. The side electrode layer 151 may be formed on portions of the sidewalls of the first trench 131, rather than on the entire surface of the sidewalls of the first trench 131. The bottom electrode layer 152 may be formed on the bottom surface of the first trench 131.

Figure 18:
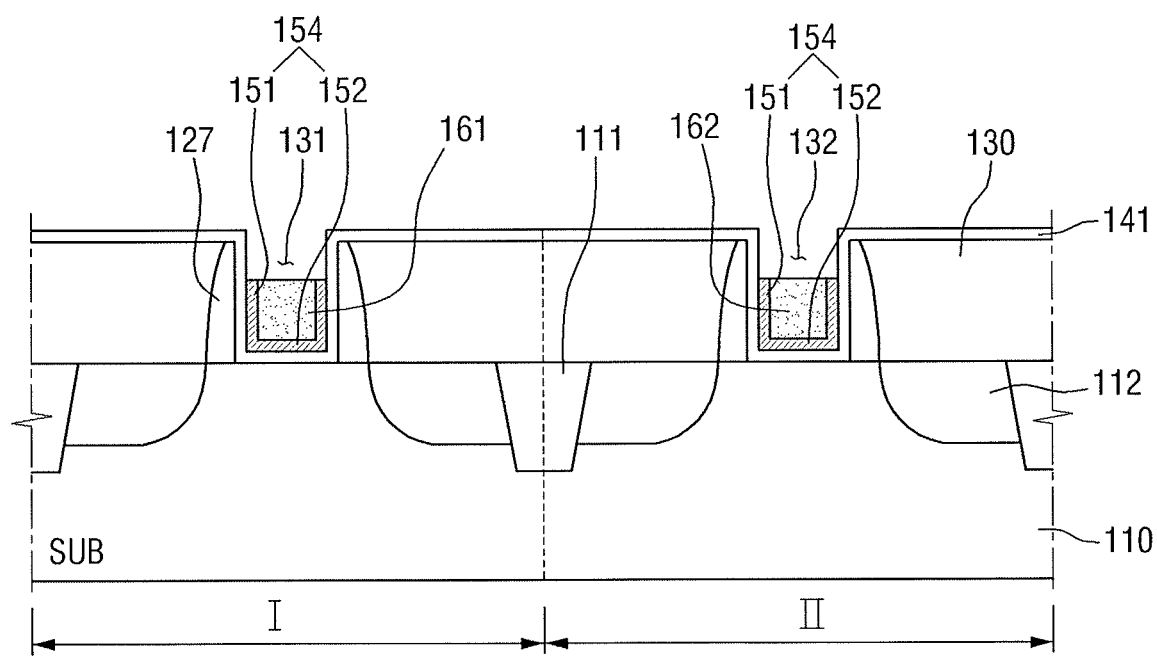
FIGS. 18 through 20 illustrate cross-sectional views of intermediate structures for explaining a method of manufacturing a semiconductor device according to an exemplary embodiment.
Figure 19:
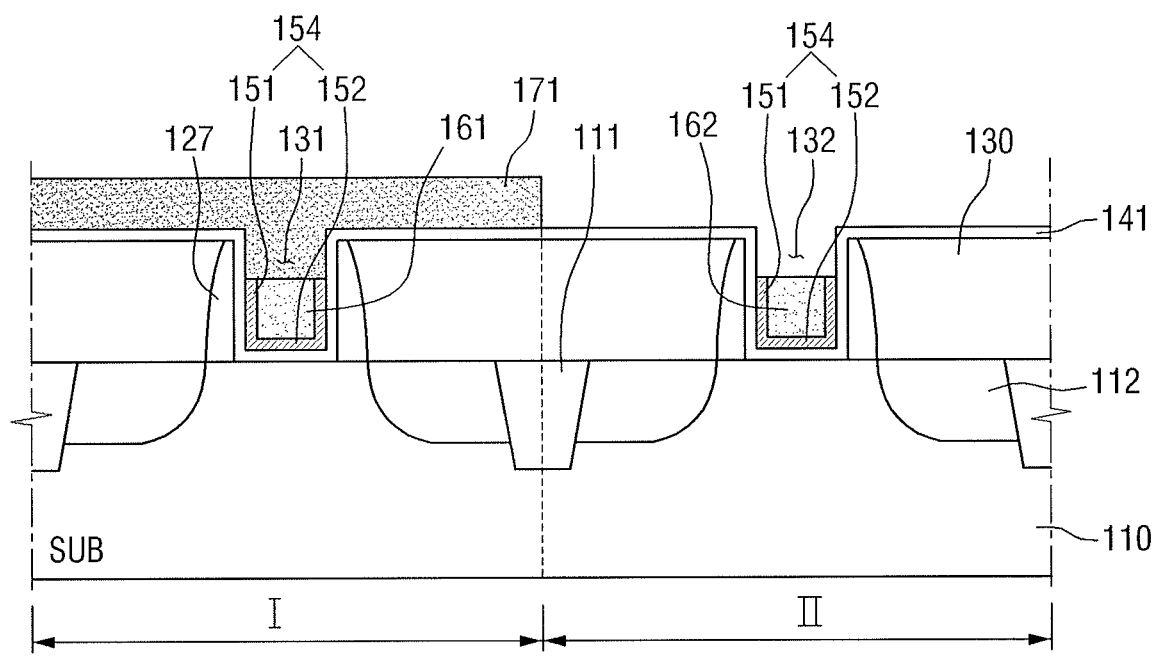
Figure 20:
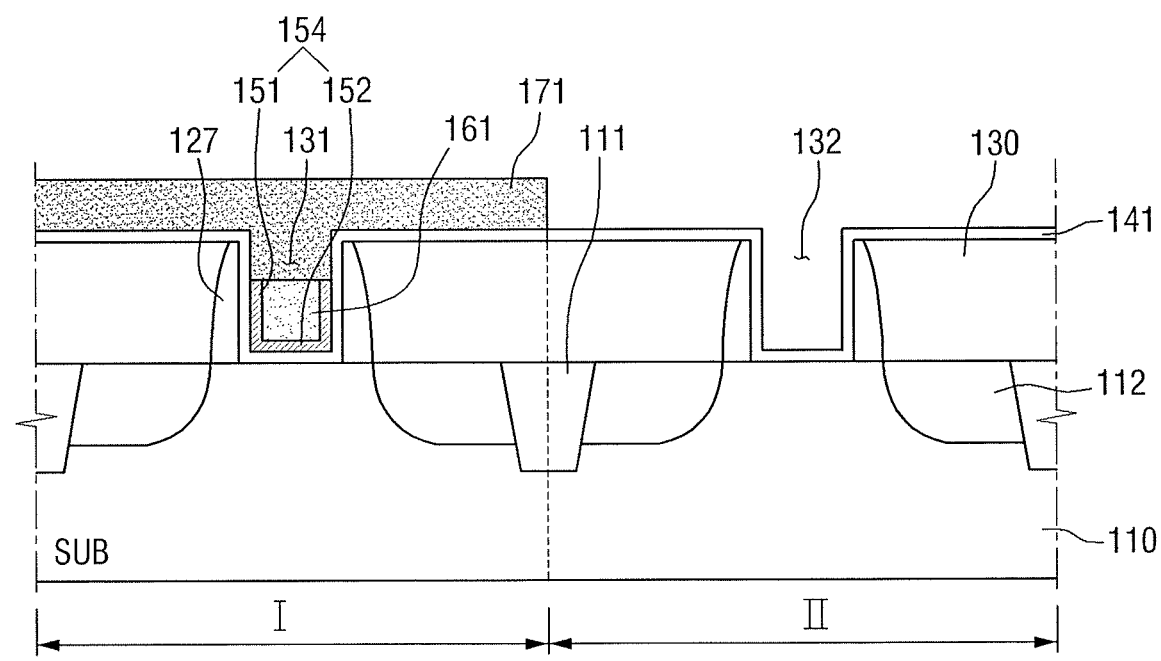

A method of manufacturing a semiconductor device according to a third exemplary embodiment will now be described with reference to FIG. 4 and FIGS. 18 through 20. FIGS. 18 through 20 illustrate cross-sectional views of intermediate structures for explaining a method of manufacturing a semiconductor device according to the third exemplary embodiment. In FIGS. 18 through 20, substantially the same components as those in FIGS. 2 to 14 are denoted by the same reference numerals and detailed descriptions thereof will not be given. The manufacturing method of the semiconductor device according to the second embodiment is different from the manufacturing method of the semiconductor device according to the first embodiment in view of processes corresponding to those shown in FIGS. 9 and 10, and the differences are mainly described below.

Referring to FIGS. 8 and 18, first and second sacrificial layer patterns 161 and 162 may be formed in the first and second trenches 131 and 132, respectively, to fill portions of the first and second trenches 131 and 132. The first and second sacrificial layer patterns 161 and 162 may be formed in the same manner as described with respect to the method illustrated in FIGS. 1 through 14. Using the first and second sacrificial layer pattern 161 and 162 as masks, portions of first and second metal layers 154a and 154b are etched to entirely remove the first top metal layer 153a and the second top metal layer 153b, and partially remove a first side metal layer 151a and a second side metal layer 151b. During the etching process, the first and second sacrificial layer patterns 160 and 161 may remain in the first and second trenches 131 and 132, respectively. Accordingly, first electrode layers 154 may be formed in both the first and second trenches 131 and 132. Each of the first electrode layers 154 may include a first side electrode layer 151 and a first bottom electrode layer 152.

Referring to FIGS. 19 and 20, a mask layer pattern 171 may be formed so as to cover the first region I of the substrate 110 and may be used as a mask to sequentially remove the second sacrificial layer pattern 162 and the first electrode layer 154 formed on the second region II. Accordingly, only the first electrode layer 154 formed in the first region I may remain. Then, the mask layer pattern 171 and the first sacrificial layer pattern 161 may be removed to complete the first electrode layer 154 only within the first trench 131.

Figure 21:
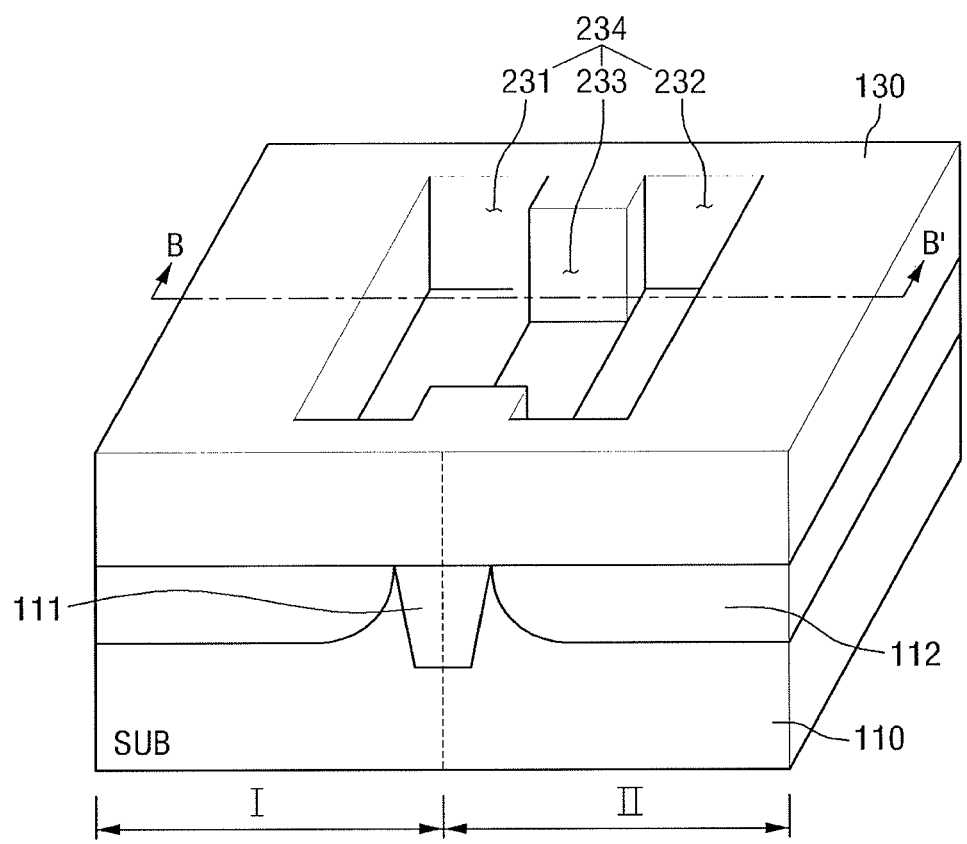
FIGS. 21 through 28 illustrate a perspective view and cross-sectional views of intermediate structures for explaining a method of manufacturing a semiconductor device according to an exemplary embodiment.
Figure 22:
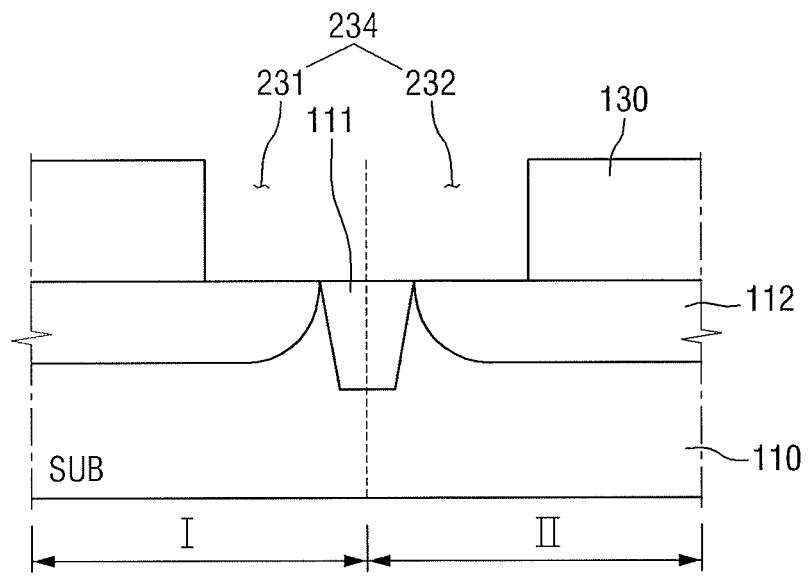

A method of manufacturing a semiconductor device according to a fourth exemplary embodiment will now be described with reference to FIGS. 21 through 28. FIG. 21 illustrates a perspective view of an intermediate structure for explaining a method of manufacturing a semiconductor device according to a fourth exemplary embodiment. FIG. 22 illustrates a cross-sectional view taken along line B-B' of FIG. 21. FIGS. 23 through 28 illustrate cross-sectional views of intermediate structures for explaining the method of manufacturing a semiconductor device shown in FIG. 21. The manufacturing method of the semiconductor device according to this embodiment is different from the manufacturing method of the semiconductor device according to the first embodiment in that first and second trenches 231 and 232 are interconnected, and the differences are mainly described below.

First, referring to FIGS. 21 and 22, an interlayer dielectric film 130 including a trench 234 is formed on a substrate 110 in the same manner as described with respect to the method illustrated with respect to FIGS. 1 through 14. The trench 234 may extend in a first direction and may include a first trench 231, a second trench 232, and a connecting trench 233 (which may be between the first trench 231 and the second trench 232). The first trench 231 may be interconnected to the second trench 232 by the connecting trench 233. The connecting trench 233 may extend across a boundary between a first region I and a second region II of the substrate 110.

While FIG. 21 illustrates the connecting trench 233 are being shorter than the first and second trenches 231 and 232 in the first direction (the first direction being a direction extending between the first and second trenches 231 and 232 or a direction perpendicular to the direction extending between the first and second trenches 231 and 232); however, embodiments are not limited thereto. For example, the connecting trench 233 may have the same length in the first direction as the first and second trenches 231 and 232. A height of each of the connecting trench 233, the first trench 231, and the second trench 232 may be substantially equal. An isolation region 111 may be formed in a portion of the substrate 112 underlying the connecting trench 233 and may separate the first and second trenches 231 and 232 from each other within the substrate 110.

The substrate 110 may include the first region I and the second region II. For example, the first region I may be a PMOS region and the second region II may be an NMOS region, or vice versa.

Figure 23:
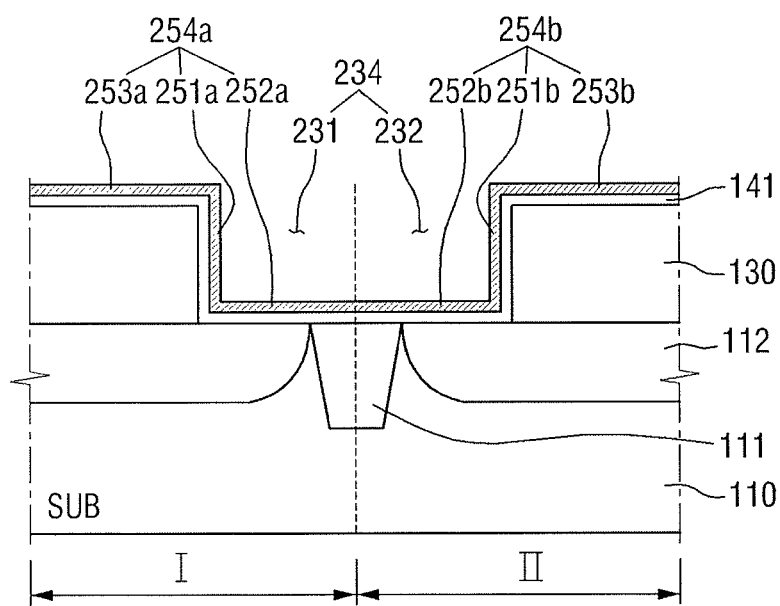

Referring to FIG. 23, first and second metal layers 254a and 254b may be embedded in the first and second trenches 231 and 232, respectively. For example, a conductive layer may be deposited conformally along a profile of the substrate 110 having thereon the interlayer dielectric film 130 including the trench 234. The conductive layer may be formed by using CVD, PVD, ALD, or a sputtering technique so as to form first and second metal layers 254a and 254b.

The first metal layer 254a may include a first bottom metal layer 252a formed at a bottom of the first trench 231, a first side metal layer 251a formed along sidewalls of the first trench 231, and a first top metal layer 253a formed on the interlayer dielectric film 130 disposed on the first region I of the substrate 110. The second metal layer 254b may include a second bottom metal layer 252b formed at a bottom of the second trench 232, a second side metal layer 251b formed along sidewalls of the second trench 232, and a second top metal layer 253b formed on the interlayer dielectric film 130 disposed on the second region II of the substrate 110. The first bottom metal layer 252a and the second bottom metal layer 252b may extend to cover portions of the bottom surface of the connecting trench 233.

Before forming the first and second metal layers 254a and 254b, an insulating layer 141 may be formed in the trench 234 along profiles of the trench 234 and the interlayer dielectric film 130.

Figure 24:
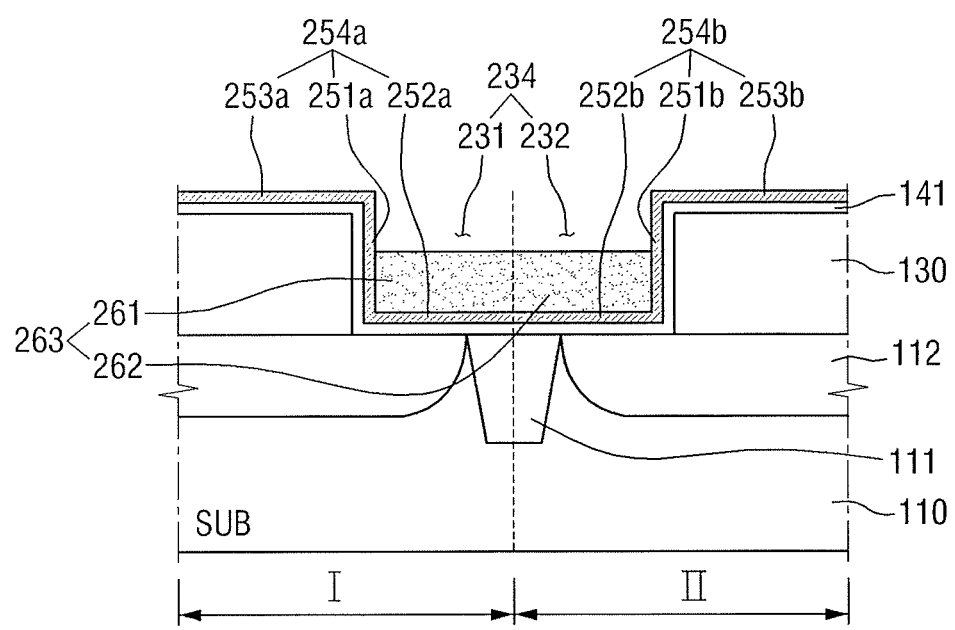
Figure 25:
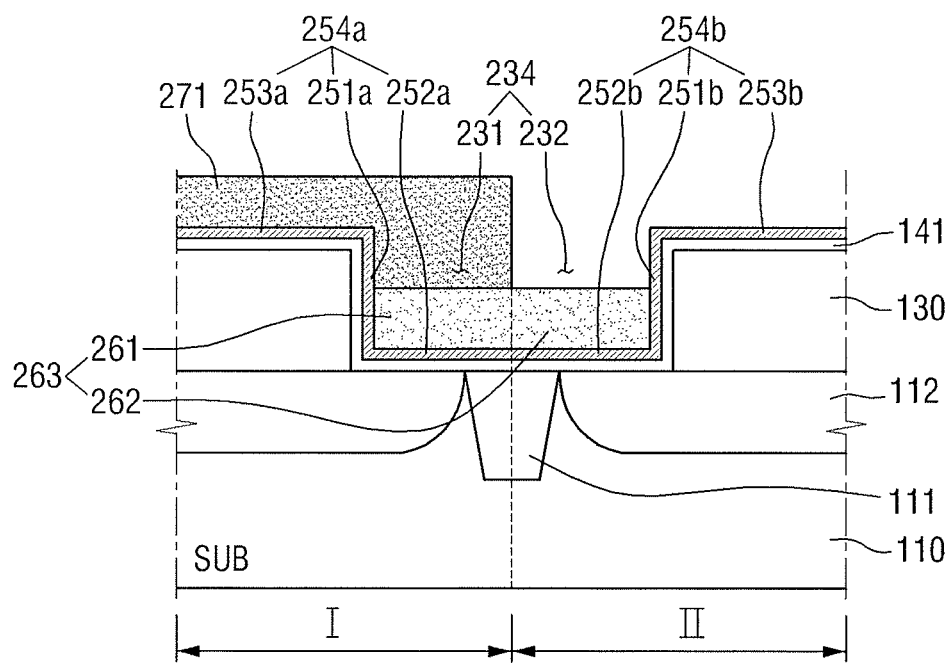
Figure 26:
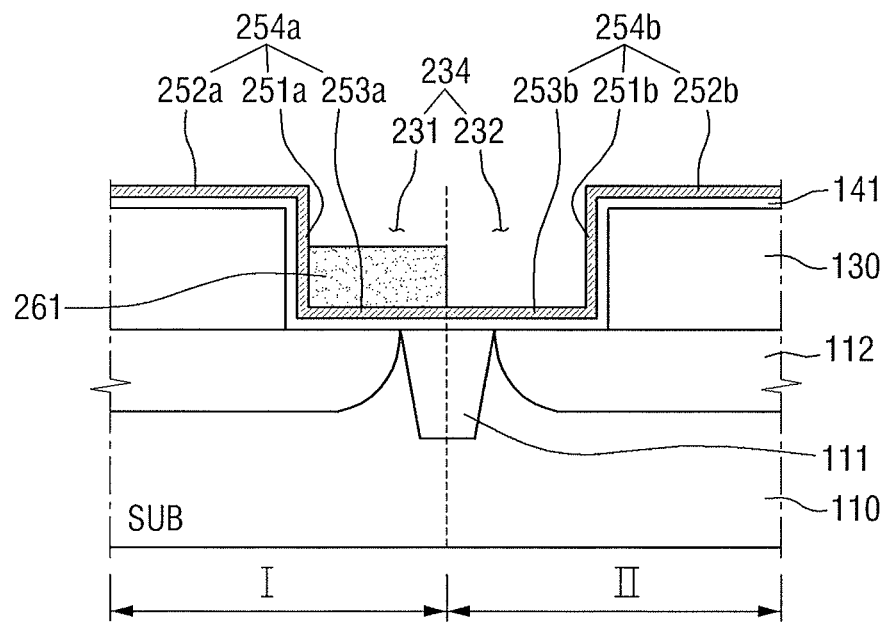

Referring to FIGS. 24 through 26, a sacrificial layer pattern 261 filling a portion of the trench 234, e.g., filling the first trench 231 and a portion of the connecting trench 233, may be formed.

For example, referring to FIG. 24, a sacrificial layer may be formed over the substrate 110 to a thickness to cover the interlayer dielectric film 130 while filling the trench 234 and may then be etched back so as to form first and second sacrificial layer patterns 261 and 262 that fill portions of the first and second trenches 231 and 232, respectively. The sacrificial layer may be formed over the substrate 110 so that a top surface of the sacrificial layer is higher than a top surface of the interlayer dielectric film 130 and may be etched so that its top surface is lower than the top surface of the interlayer dielectric film 130. Thus, portions of the sidewalls of the first and second side metal layers 251a and 251b may be exposed. The sacrificial layer may contain siloxane and be formed by coating a material containing a siloxane over the substrate 110.

Referring to FIGS. 25 and 26, a mask layer pattern 271 covering at least the first trench 231 may be formed on the first region I of the substrate 110. The mask layer pattern 271 may be used as a mask to remove the second sacrificial layer pattern 262 in the second region II, thereby the sacrificial layer pattern 261 in the first region I may remain on the substrate 110, e.g., in the first trench 231 in the first region I.

The first sacrificial layer pattern 261 remaining after removal of the second sacrificial layer pattern 162 may become a final sacrificial layer pattern 261. After forming the sacrificial layer pattern 261, the second metal layer 254b and the first top metal layer 253a may be entirely exposed, and the first side metal layer 251a may be partially exposed.

Figure 27:
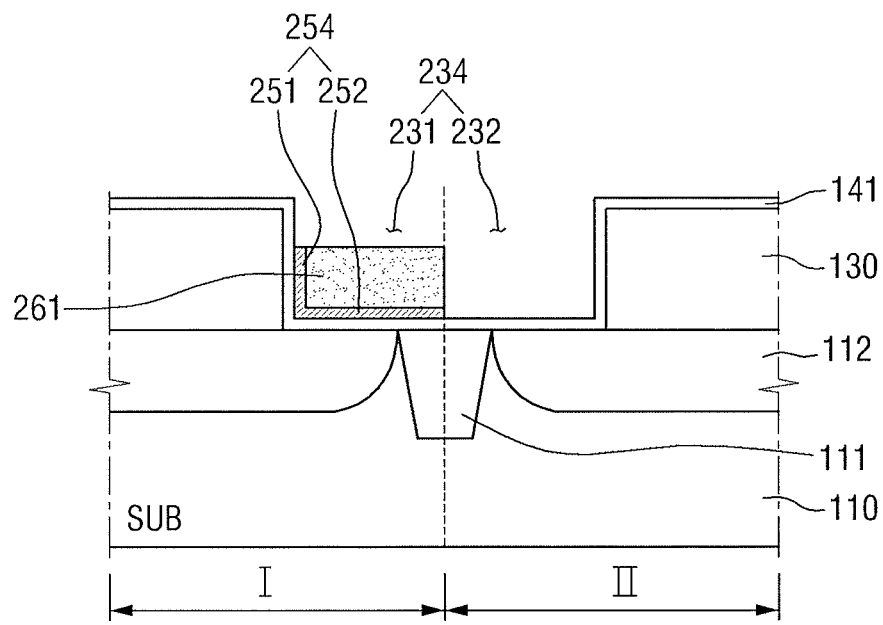

Referring to FIG. 27, the exposed first metal layer 254a may be partially etched, the second metal layer 254a may be entirely etched, and the sacrificial layer pattern 261 may be removed to form a first electrode layer 254 in the first region I. The first electrode layer 254 may be formed in the first trench 231 and may extend to a portion of the connecting trench 233. Alternatively, the first electrode layer 254 may be formed only in the first trench 231. The exposed second metal layer 254b may be entirely etched, and the exposed portions of the first metal layer 254a, e.g., the first top metal layer 253a and a portion of the first side metal layer 251a, may be etched using the sacrificial layer pattern 261 as a mask, followed by removal of the sacrificial layer pattern 261 using an etching solution without HF.

The first electrode layer 254 may include a first side electrode layer 251 formed on a sidewall of the first trench 231 and a first bottom electrode layer 252 formed at a bottom of the first trench 231. A top surface of the first side electrode layer 251 may be lower than a top surface of the first trench 231.

According to exemplary embodiments, since the sacrificial layer pattern 261 contains a siloxane, an HF containing etching solution does not need to be used. For example, the sacrificial layer pattern 261 may be etched using an etching solution with alkylammonium hydroxide, thereby reducing the possibility of and/or preventing damage to the insulating layer 141 during etching.

Figure 28:
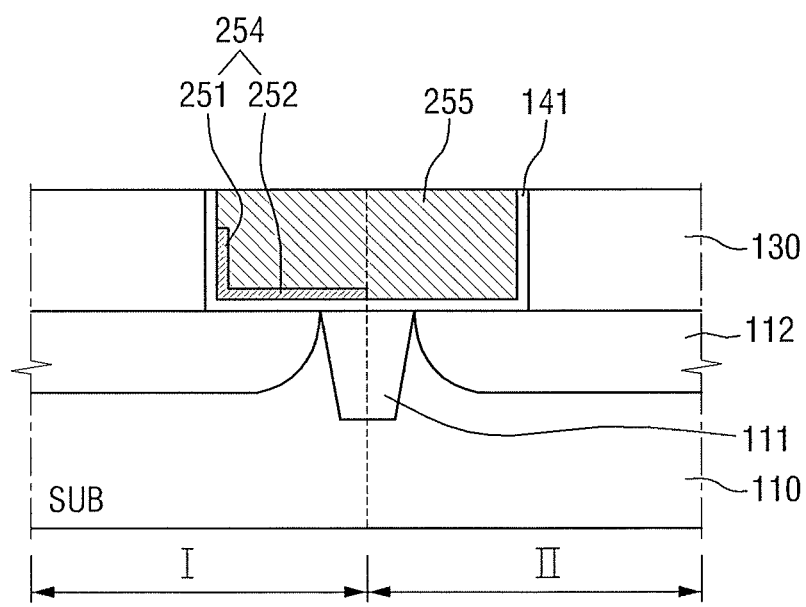

Referring to FIG. 28, a second electrode layer 255 filling the trench 234 may be formed in the same manner as described with respect to the method illustrated in FIGS. 1 through 14. According to exemplary embodiments, since an HF solution is not used during etching of the sacrificial layer pattern 261, the insulating layer 141 may not be damaged. Thus, when a second electrode layer 255 is formed on the previously formed insulating layer 141 instead of forming a new insulating layer, the device characteristics may not be degraded.

The method of manufacturing a semiconductor device according to exemplary embodiments may facilitates formation of electrode layers having different work functions in the same trench using the same process. The method may also provide a sufficient volume that will be occupied by the second electrode layer 255, thereby allowing ease of formation of the second electrode layer 255. Further, the sacrificial layer pattern 261 containing a siloxane may be etched using a solution without FIF, thereby reducing damage to the insulating layer 141 during etching.

The methods of manufacturing a semiconductor device according to the exemplary embodiments may be applied to the manufacture of transistors that can be used in logic devices or memory devices.

By way of summation and review, a gate electrode of a transistor may be formed of polysilicon. However, it is very difficult to reduce a line width and/or a gate width of the gate electrode including polysilicon due to limits of photolithography processes. Thus, a gate forming process using a metal material, instead of polysilicon, has been developed. However, formation of a metal gate may cause damage to an underlying dielectric layer, thereby degrading the device reliability. For example, during a process of manufacturing a semiconductor device, a sacrificial layer composed of $SiO_2$ may be stripped using an HF etching solution, and the dielectric layer may be damaged. Also, in a PMOS region of the semiconductor device, an Al gap-fill may not be sufficient.

In contrast, exemplary embodiments relate to a method of manufacturing a semiconductor device that may increase a volume occupied by a metal gate without causing damage to a gate insulating layer during etching. The sacrificial layer may be etched using an etching solution that excludes HF. Accordingly, damage to the dielectric layer may be reduced. The metal layer (TiN) in the trench may be partially etch-backed, and a gap-fill margin in the PMOS region may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    providing a substrate having first and second regions defined thereon;
    forming an interlayer dielectric film on the substrate, the interlayer dielectric film including first and second trenches on the first and second regions of the substrate, respectively;
    forming a first metal layer along a sidewall and a bottom surface of the first trench and along a top surface of the interlayer dielectric film in the first region, and forming a second metal layer along a sidewall and a bottom surface of the second trench and along a top surface of the interlayer dielectric film in the second region;
    forming a first sacrificial layer pattern on the first metal layer such that the first sacrificial layer fills a portion of the first trench; and
    forming a first electrode layer by etching the first metal layer and the second metal layer using the first sacrificial layer pattern, and removing the first sacrificial layer pattern.

2. The method as claimed in claim 1, wherein forming the first sacrificial layer pattern includes:
    forming the first sacrificial layer pattern on the first metal layer such that the first sacrificial layer pattern fills a portion of the first trench,
    forming a second sacrificial layer pattern on the second metal layer such that the second sacrificial layer pattern fills a portion of the second trench, and
    removing the second sacrificial layer pattern such that the first sacrificial layer pattern remains in the first trench.

3. The method as claimed in claim 2, wherein forming the first and second sacrificial layer patterns includes:
    forming a sacrificial layer over the first and second metal layers using a coating process, and
    etching the sacrificial layer so as to expose top portions of the first and second metal layers formed on the sidewalls of the first and second trenches, respectively, such that the first and second sacrificial layer patterns are formed.

4. The method as claimed in claim 1, wherein:
    while forming the first sacrificial layer pattern, a second sacrificial layer is formed, the second sacrificial layer being formed on the second metal layer such that the second sacrificial layer fills a portion of the second trench, and
    forming the first electrode layer includes:
        etching the first and second metal layers using the first and second sacrificial layer patterns, respectively,
        forming a mask pattern on the first sacrificial layer pattern,
        removing the second sacrificial layer pattern and remaining portions of the second metal layer, and
        removing the mask pattern and removing the first sacrificial layer pattern to form the first electrode layer.

5. The method as claimed in claim 1, wherein removing the first sacrificial layer pattern includes performing etching using an etching solution that excludes hydrogen fluoride.

6. The method as claimed in claim 5, wherein the first sacrificial layer pattern includes a siloxane, and the etching solution contains an alkylammonium hydroxide.

7. The method as claimed in claim 1, wherein the first and second regions form a P-type metal-oxide-semiconductor region and an N-type metal-oxide-semiconductor region, respectively.

8. The method as claimed in claim 1, wherein the first electrode layer is formed at the bottom surface of the first trench and along a portion of the sidewall of the first trench.

9. The method as claimed in claim 1, further comprising forming a second electrode layer filling the first and second trenches, the second electrode layer being formed on the first electrode layer.

10. The method as claimed in claim 1, wherein the first and second metal layers are made of a same material.

11. The method as claimed in claim 1, therein the first and second trenches are interconnected to each other.

12. The method as claimed in claim 1, further comprising forming an insulating layer in the first and second trenches and below the first and second metal layers.

13. A method of manufacturing a semiconductor device, the method comprising:
    forming an interlayer dielectric film on a substrate such that the interlayer dielectric film includes a trench;
    forming an insulating layer along a sidewall and a bottom of the trench and along a top surface of the interlayer dielectric film;
    forming a metal layer on the insulating layer along the sidewall and the bottom of the trench and along the top surface of the insulating layer;
    forming a sacrificial layer pattern that includes a siloxane, the sacrificial layer pattern being formed to fill a portion of the trench and being formed on the metal layer;
    forming a first electrode layer by etching the metal layer using the sacrificial layer pattern; and
    removing the sacrificial layer pattern using an etching solution that excludes hydrogen fluoride.

14. The method as claimed in claim 13, wherein the trench includes a first trench and a second trench, the metal layer includes a first metal layer formed in the first trench and a second metal layer formed in the second trench, and the first electrode layer is completed by partially removing the first metal layer and entirely removing the second metal layer.

15. The method as claimed in claim 14, further comprising forming a second electrode layer that fills the second trench on the insulating layer in the second trench.

16. A method of manufacturing a semiconductor device, the method comprising:

providing a substrate having first and second regions defined thereon;

forming an interlayer dielectric film on the substrate, the interlayer dielectric film including first and second trenches on the first and second regions of the substrate, respectively;

forming a metal layer on the substrate, the metal layer including a first metal layer in the first region and a second metal layer in the second region;

forming a sacrificial layer pattern on the first metal layer such that the sacrificial layer is on the first metal layer and fills a portion of the first trench, the sacrificial layer being excluded in the second region;

removing portions of the metal layer after forming the sacrificial layer pattern such that a part of the first metal layer remains under the sacrificial layer pattern; and removing the sacrificial layer pattern using an etching solution that excludes hydrogen fluoride such that a first electrode layer is formed, the first electrode layer corresponding to the part of the first metal layer remaining in the first trench.

17. The method as claimed in claim 16, wherein during the removal of the portions of the metal layer, the second metal layer is completely removed using the sacrificial layer pattern as an etching mask.

18. The method as claimed in claim 17, wherein during the removal of the portions of the metal layer, the part of the first metal layer remaining under the sacrificial layer pattern covers a bottom surface and a partial portion of a sidewall of the first trench, and other parts of the first metal layer are removed.

19. The method as claimed in claim 16, wherein an uppermost surface of first electrode layer is lower than an uppermost surface of the interlayer dielectric film.

20. The method as claimed in claim 19, further comprising, after removing the sacrificial layer pattern, forming second electrode layers in the first and second trenches, respectively, such that the first trench includes the first and second electrode layers.

* * * * *